(12) United States Patent
Shen

(10) Patent No.: US 11,175,027 B2
(45) Date of Patent: Nov. 16, 2021

(54) LIGHTING APPARATUS WITH LIGHT SOURCE PLATE SECURED BETWEEN TWO CONNECTOR PORTIONS

(71) Applicant: XIAMEN LEEDARSON LIGHTING CO. LTD., Fujian (CN)

(72) Inventor: Digen Shen, Fujian (CN)

(73) Assignee: XIAMEN LEEDARSON LIGHTING CO. LTD., Xiamen (CN)

( * ) Notice: Subject to any disclaimer, the term of this patent is extended or adjusted under 35 U.S.C. 154(b) by 0 days.

(21) Appl. No.: 16/906,386

(22) Filed: Jun. 19, 2020

(65) Prior Publication Data
US 2020/0400295 A1 Dec. 24, 2020

(51) Int. Cl.
| | |
|---|---|
| F21V 19/00 | (2006.01) |
| F21V 23/00 | (2015.01) |
| F21V 29/70 | (2015.01) |
| F21V 21/088 | (2006.01) |
| F21V 23/06 | (2006.01) |
| H05K 1/11 | (2006.01) |
| H05K 13/04 | (2006.01) |

(52) U.S. Cl.
CPC .......... *F21V 23/004* (2013.01); *F21V 21/088* (2013.01); *F21V 23/007* (2013.01); *F21V 23/06* (2013.01); *F21V 29/70* (2015.01); *H05K 1/11* (2013.01); *H05K 13/0465* (2013.01)

(58) Field of Classification Search
CPC .. F21V 19/003; F21V 19/001; F21V 19/0025; F21V 19/0035; F21V 19/004; F21V 23/003; F21V 23/004
See application file for complete search history.

(56) References Cited

U.S. PATENT DOCUMENTS

| | | | | |
|---|---|---|---|---|
| 7,226,189 B2 * | 6/2007 | Lee | ........................... | F21V 3/00 362/294 |
| 7,303,301 B2 * | 12/2007 | Koren | ..................... | F21V 29/51 362/101 |
| 7,445,355 B2 * | 11/2008 | Wu | ........................... | F21K 9/00 362/249.01 |
| 7,452,110 B2 * | 11/2008 | Chen | .................... | F21V 19/0045 362/294 |
| 7,549,786 B2 * | 6/2009 | Higley | ..................... | F21L 4/027 362/646 |
| 7,872,278 B2 * | 1/2011 | Stoyan | ................... | F21V 17/164 257/99 |
| 8,342,734 B2 * | 1/2013 | Ohmi | ..................... | F21V 29/763 362/657 |
| 8,395,304 B2 * | 3/2013 | Hisayasu | ................. | F21K 9/238 313/46 |
| 9,086,212 B2 * | 7/2015 | Yang | ...................... | F21V 19/004 |
| 9,562,651 B2 * | 2/2017 | Echigo | .................. | F21V 29/507 |
| 10,408,398 B2 * | 9/2019 | Kim | ..................... | F21V 19/0035 |
| 2015/0131301 A1 * | 5/2015 | Ho | ....................... | F21V 19/0055 362/382 |
| 2019/0008045 A1 * | 1/2019 | Iedema | ................. | F21V 19/004 |

* cited by examiner

Primary Examiner — Ismael Negron
(74) Attorney, Agent, or Firm — Chun-Ming Shih; Lanway IPR Services

(57) ABSTRACT

A lighting apparatus includes a driver configured to convert external power to a driving current, a light source connector with top and bottom portions separated by a distance, and a light source provided on a light source plate including a conductive patch. The light source plate is held between the top portion and the bottom portion, such that the driving current is supplied to the light source plate by the conductive path routed via the light source connector.

17 Claims, 18 Drawing Sheets

LIGHTING APPARATUS WITH LIGHT SOURCE PLATE SECURED BETWEEN TWO CONNECTOR PORTIONS

FIELD

The present application is related to a lighting apparatus and more particularly related to a lighting apparatus with a flexible connecting structure.

BACKGROUND

The time when the darkness is being lighten up by the light, human have noticed the need of lighting up this planet. Light has become one of the necessities we live with through the day and the night. During the darkness after sunset, there is no natural light, and human have been finding ways to light up the darkness with artificial light. From a torch, candles to the light we have nowadays, the use of light have been changed through decades and the development of lighting continues on.

Early human found the control of fire which is a turning point of the human history. Fire provides light to bright up the darkness that have allowed human activities to continue into the darker and colder hour of the hour after sunset. Fire gives human beings the first form of light and heat to cook food, make tools, have heat to live through cold winter and lighting to see in the dark.

Lighting is now not to be limited just for providing the light we need, but it is also for setting up the mood and atmosphere being created for an area. Proper lighting for an area needs a good combination of daylight conditions and artificial lights. There are many ways to improve lighting in a better cost and energy saving. LED lighting, a solid-state lamp that uses light-emitting diodes as the source of light, is a solution when it comes to energy-efficient lighting. LED lighting provides lower cost, energy saving and longer life span.

The major use of the light emitting diodes is for illumination. The light emitting diodes is recently used in light bulb, light strip or light tube for a longer lifetime and a lower energy consumption of the light. The light emitting diodes shows a new type of illumination which brings more convenience to our lives. Nowadays, light emitting diode light may be often seen in the market with various forms and affordable prices.

After the invention of LEDs, the neon indicator and incandescent lamps are gradually replaced. However, the cost of initial commercial LEDs was extremely high, making them rare to be applied for practical use. Also, LEDs only illuminated red light at early stage. The brightness of the light only could be used as indicator for it was too dark to illuminate an area. Unlike modern LEDs which are bound in transparent plastic cases, LEDs in early stage were packed in metal cases.

In 1878, Thomas Edison tried to make a usable light bulb after experimenting different materials. In November 1879, Edison filed a patent for an electric lamp with a carbon filament and keep testing to find the perfect filament for his light bulb. The highest melting point of any chemical element, tungsten, was known by Edison to be an excellent material for light bulb filaments, but the machinery needed to produce super-fine tungsten wire was not available in the late 19th century. Tungsten is still the primary material used in incandescent bulb filaments today.

Early candles were made in China in about 200 BC from whale fat and rice paper wick. They were made from other materials through time, like tallow, spermaceti, colza oil and beeswax until the discovery of paraffin wax which made production of candles cheap and affordable to everyone. Wick was also improved over time that made from paper, cotton, hemp and flax with different times and ways of burning. Although not a major light source now, candles are still here as decorative items and a light source in emergency situations. They are used for celebrations such as birthdays, religious rituals, for making atmosphere and as a decor.

Illumination has been improved throughout the times. Even now, the lighting device we used today are still being improved. From the illumination of the sun to the time when human can control fire for providing illumination which changed human history, we have been improving the lighting source for a better efficiency and sense. From the invention of candle, gas lamp, electric carbon arc lamp, kerosene lamp, light bulb, fluorescent lamp to LED lamp, the improvement of illumination shows the necessity of light in human lives.

There are various lighting devices. For light device to function normally, it is important to handle carefully on how to connect the components and protect the components to provide a long life span and a stable structure.

SUMMARY

In some embodiments, a lighting apparatus, includes a driver, a light source connector, and a light source plate.

The driver is used for converting an external power to a driving current, e.g. a from a 110V/220V alternating current source to a direct current driving current.

The light source connector structure has a top portion and a bottom portion. The top portion and the bottom portion keep a distance and clip the light source plate between the top portion and the bottom portion. The driving current is supplied to the light source plate with a conductive path routed via the light source connector.

In some embodiments, the top portion of the light source connector includes a pressing block, an elastic clip, a wire and a fastener. The surface of the light source plate has a conductive portion. The pressing block has an elastic clip hole. The wire is capable of inserting into the wire hole. The wire and the elastic clip are contacted. The elastic clip electrically connects to the conductive portion of the light source plate. The fastener presses and connects the wire and the elastic clip together.

In some embodiments, the fastener is fastened to the pressing block without applying force on the lights source plate to prevent the light source plate to be deformed.

In some embodiments, the light source plate has a substrate and a light emitting portion located at a central area of the light source plate.

In some embodiments, there are four conductive portions and the conductive portions output in two paths.

In some embodiments, the elastic clip has a plugging portion, an elastic portion and a transition portion. Two sides of the transition portion respectively connect with the plugging portion and the elastic portion. The plugging portion plugs in the elastic clip hole.

In some embodiments, a length of the plugging portion is longer a length of the transition portion to prevent the transition portion deformed.

In some embodiments, the transition portion and the elastic portion are bent to form a U-shape portion. One lateral wall of the U-shape portion is the transition portion and the other lateral wall of the U-shape portion is the elastic portion.

In some embodiments, a bottom portion of the U-shape portion is a bent junction of the transition portion and the elastic portion.

In some embodiments, an opening of the U-shape portion faces to an output part of the pressing block to make the elastic portion extending from a head to a tail gradually toward the output part of the pressing block along the plugging direction of the elastic clip.

In some embodiments, the pressing block protects the bent junction of the transition portion and the elastic portion to extend a life span of the elastic clip.

In some embodiments, the elastic portion gradually aslant extends from the transition portion to the outer part of the pressing block until the elastic portion engages with the conductive portion.

In some embodiments, the light source plate is uneven, the elastic portion is inserted into the pressing block under the pressure function of a self-elasticity and output protrusion so that the elastic portion does not deadly lock on the light source plate.

In some embodiments, a cross-section profile of the plugging portion inserted in the elastic clip hole is an arc shape.

In some embodiments, the bottom portion of the light source connector is a fixing unit made of a heat sink for heat dissipation.

In some embodiments, the top portion of the light source connector is an interface board having a wire passing hole for passing a wire carrying the driving current. The wire is soldered on the interface board. The bottom portion of the light source connector is a fixing board, the interface board and the light source plate are both fixed on the interface board.

In some embodiments, a fastener is connected to the interface board and the fixing board to prevent the light source plate being deformed.

In some embodiments, the top portion of the light source connector is an interface board with a conductive hole, a plug pin carrying the driving current passing through the conductive hole to routes the driving current to the light source plate.

In some embodiments, the driver and the plug pin are connected with a wave soldering to make the driver and the plug pin as a module.

In some embodiments, the interface board and the light source plate are fixed together as a module by a reflow soldering process.

DETAILED DESCRIPTION

Figure 21:
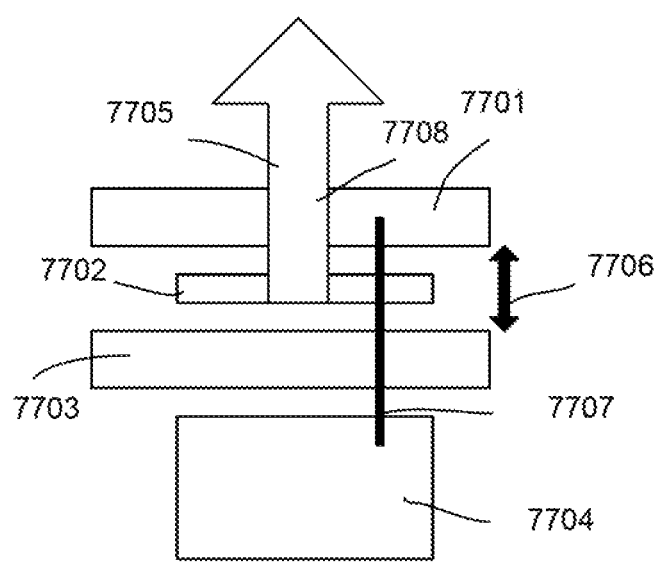
FIG. 21 shows a structural diagram of an embodiment.

In FIG. 21, a lighting apparatus includes a driver 7704, a light source connector and a light source plate 7702.

The driver 7704 is used for converting an external power to a driving current, e.g. from a 110V/220V alternating current source to a direct current driving current.

The light source connector structure has a top portion 7701 and a bottom portion 7702. The top portion 7701 and the bottom portion 7702 keep a distance 7706 and clip the light source plate 7702 between the top portion 7701 and the bottom portion 7703. The driving current is supplied to the light source plate 7702 with a conductive path 7707 routed via the light source connector. There is a light escape 7708 for allowing a light 7705 of the light source plate 7702 to pass through.

In some embodiments, the top portion of the light source connector includes a pressing block, an elastic clip, a wire and a fastener. The surface of the light source plate has a conductive portion. The pressing block has an elastic clip hole. The wire can be inserted into the wire hole. The wire and the elastic clip are contacted. The elastic clip is electrically connected to the conductive portion of the light source plate. The fastener presses and connects the wire and the elastic clipped together.

In some embodiments, the fastener is fastened on the pressing block without applying force on the lights source plate to prevent the light source plate to be deformed.

In some embodiments, the light source plate has a substrate and a light emitting portion located at a central area of the light source plate.

In some embodiments, the quantity of the conductive portion is four and outputs in two paths.

In some embodiments, the elastic clip has a plugging portion, an elastic portion and a transition portion. Two sides of the transition portion respectively connect with the plugging portion and the elastic portion. The plugging portion are plugged in the elastic clip hole.

In some embodiments, a length of the plugging portion is longer a length of the transition portion to prevent the transition portion deformed.

In some embodiments, the transition portion and the elastic portion are bent to form a U-shape portion. One lateral wall of the U-shape portion is the transition portion and the other lateral wall of the U-shape portion is the elastic portion.

In some embodiments, a bottom portion of the U-shape portion is a bent junction of the transition portion and the elastic portion.

In some embodiments, an opening of the U-shape portion faces to an output part of the pressing block to make the elastic portion extending from a head to a tail gradually toward the output part of the pressing block along the plugging direction of the elastic clip.

In some embodiments, the pressing block protects the bent junction of the transition portion and the elastic portion to extend a life span of the elastic clip.

In some embodiments, the elastic portion gradually aslant extends from the transition portion to the outer part of the pressing block until the elastic portion engages with the conductive portion.

In some embodiments, the light source plate is uneven. The elastic portion is inserted into the pressing block under the pressure function of a self-elasticity and output protrusion so that the elastic portion does not deadly lock on the light source plate.

In some embodiments, a cross-section profile of the plugging portion inserted in the elastic clip hole is an arc shape.

In some embodiments, the bottom portion of the light source connector is a fixing unit made of a heat sink for heat dissipation.

In some embodiments, the top portion of the light source connector is an interface board having a wire passing hole for passing a wire carrying the driving current. The wire is soldered on the interface board. The bottom portion of the light source connector is a fixing board, the interface board and the light source plate are both fixed on the interface board.

In some embodiments, a fastener is connected to the interface board and the fixing board to prevent the light source plate being deformed.

In some embodiments, the top portion of the light source connector is an interface board with a conductive hole. A plug pin carries the driving current passing through the conductive hole to routes the driving current to the light source plate.

In some embodiments, the driver and the plug pin are connected with a wave soldering to make the driver and the plug pin as a module.

In some embodiments, the interface board and the light source plate are fixed together as a module by a reflow soldering process.

Figure 1A:
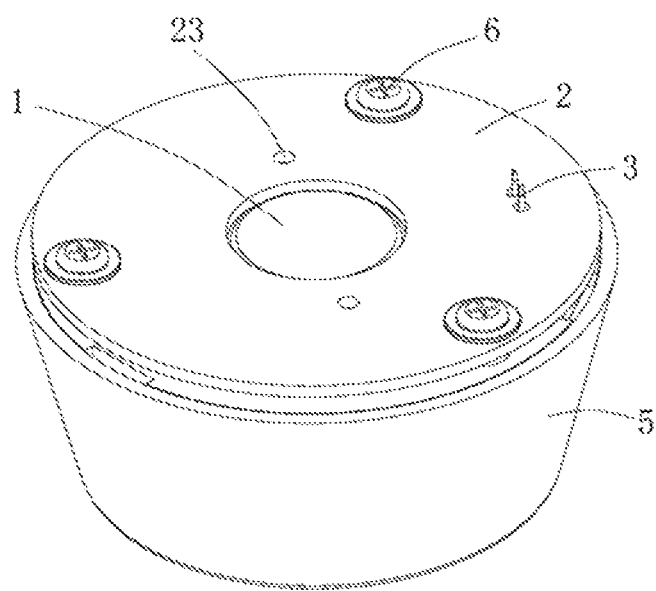
FIG. 1A illustrates a component used in a light source embodiment.
Figure 1B:
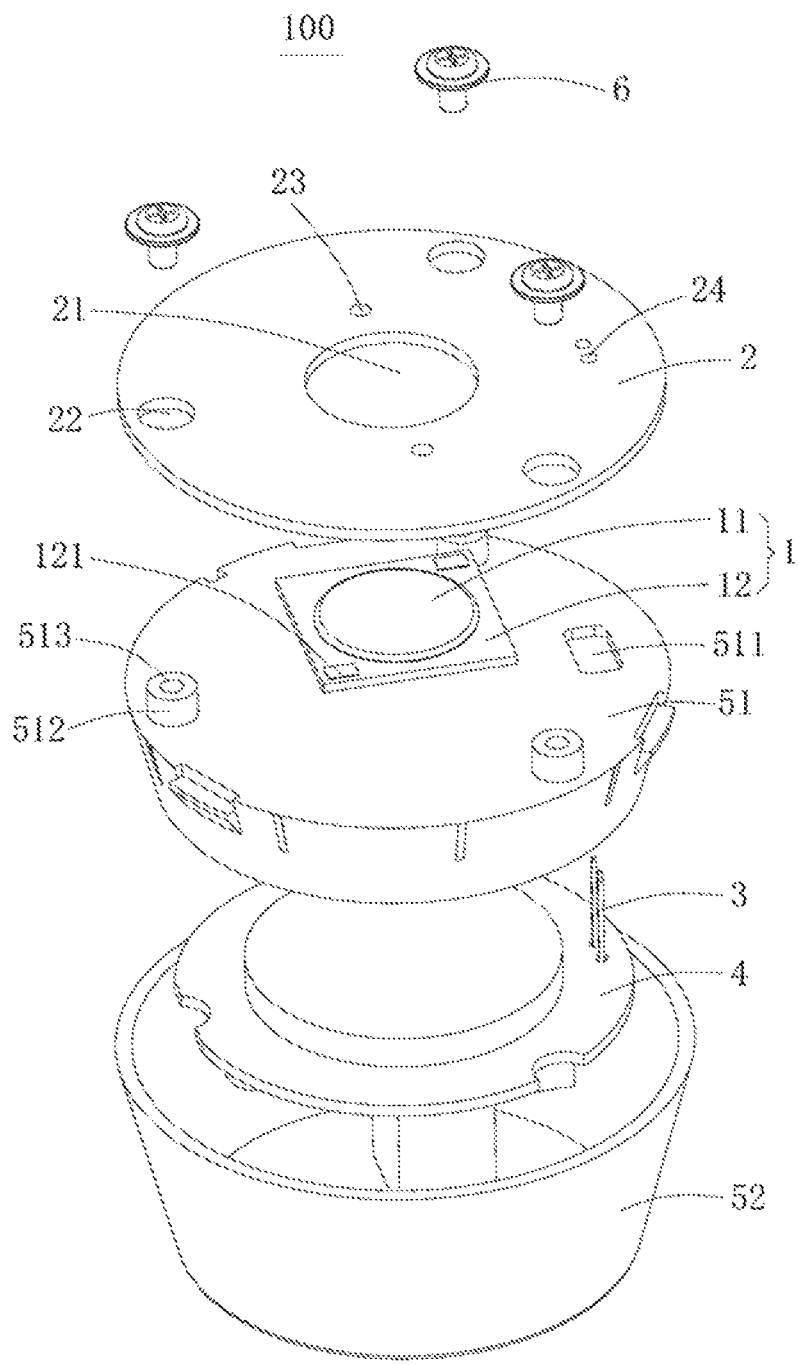
FIG. 1B illustrates an exploded diagram of the example of FIG. 1A.
Figure 1C:
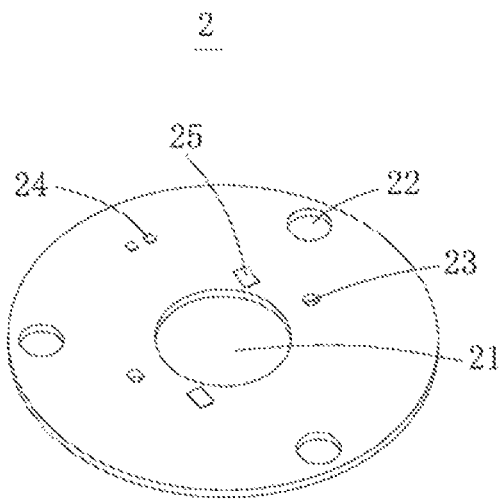
FIG. 1C illustrates a component.

FIGS. 1A, 1B and 1C illustrate one embodiment of a light source conducting connector structure 100. Please refer to FIG. 1 and FIG. 2. The light source conducting connector structure 100 has a light source plate 1, a driver 4 and an interface board 2.

The light source plate 1 is reflow soldered on the interface board 2. The light source plate 1 is reflow soldered on the interface board 2 with a reflow device. There is a heating device sets in the reflow device. The heating device heats the air or nitrogen to a certain temperature and blows the air or nitrogen to the light source plate 1 and the interface board 2.

A solder material on the light source plate 1 and the interface board 2 is melted and connected to make the light source plate 1 structurally and electrically connect on the interface board 2. When there are many soldering spots on the light source plate 1, a plurality of the soldering spot on the light source plate 1 is capable of being reflow soldered on the interface board 2. Rather than soldering an output wire on each soldering spot on the light source plate 1.

The driver 4 electrically connects with a plug pin3. The interface board 2 has a conductive hole 24 being capable of being passed through by the plug pin3. The plug pin 3 passes through and electrically connects with the conductive hole 24. The driver 4, the interface board 2 and the light source plate 1 are set adjacently to make the plug pin 3 can be inserted into the interface board 2 with only limited length.

More particularly, the plug pin 3 is capable of being soldered in the conductive hole 24. The conductive hole 24 is filled with a solder paste to make the plug pin 3 and the inner wall of the conductive hole 24 are conductive. Therefore, the driver 4 and the light source plate 1 electrically connect with the interface board 2. The interface board 2 has a conductive circuit.

The conductive circuit conducts the driver 4 and the light source plate 1. More particularly, one end of the conductive circuit electrically connects with the light source plate 1 with reflow soldering. The other end of the conductive circuit extends into the conductive hole 24 to make the conductive circuit is capable of electrically connecting with the plug pin 3. The light source plate 1 and the driver 4 are transferred with the interface board 2 and the plug pin 3. Therefore, the output wire is not soldered on the light source plate 1. When fixing the light source plate 1 is capable of being set on the interface board 2 without damaging the light source plate 1.

In the light source conducting connector structure 100 provided, the light source plate 1 is fixed on and electrically connected with the interface board 2. The driver 4 is electrically connected with the interface board 2 with the plug pin 3. Therefore, the light source plate 1 and the driver 4 electrically connect with each other with the interface board 2 and the plug pin 3 rather than soldering a wire directly on the positive and negative ends of the light source plate 1. The light source plate 1 is reflow soldered on the interface board 2 to prevent the heat of a soldering iron damaging the light source plate 1.

When fixing the light source plate 1, the fastener 6 such as a screw is capable of being pressed and connected on the interface board 2. The fixing of the interface board 2 is capable of fixing the light source plate 1 to prevent a warping deformation of the light source plate 1. Also, a light source bracket is not needed, and a molding cost is further saved.

The driver 4 and the plug pin 3 are connected with a wave soldering to make the driver 4 and the plug pin 3 are formed as an unibody structure. More particularly, one end of the plug pin 3 is plugged in a circuit board of the driver 4. A soldering flux is covered on the circuit board and the plug pin 3 with a wave, a foaming and an injection. The soldering flux is activated and melted after being warmed up. The melting soldering flux is used for soldering the plug pin 3 and the circuit board.

A wave soldering is suitable for the soldering of the circuit board with a soldering pin, a leading pin and a plug pin. The plug pin 3 is connected with the interface board 2 with soldering or wave soldering. The plug pin 3 and the conductive hole 24 are not on the light source plate 1 and the driver 4. The plug pin 3 and the conductive hole 24 are capable of being connected with the light source plate 1 and the driver 4 with the soldering iron or the wave soldering without damaging the light source plate 1 and the circuit board.

When assembling the light source conducting connector structure 100, first, use the reflow soldering to form the light source plate 1 and the interface board 2 as an unibody structure. Second, the driver 4 and the plug pin 3 are formed as an unibody structure with the wave soldering. Then the two units above are assembled. Last, the plug pin 3 inserted into and electrically connects the interface board 2. Therefore, the two units above are capable of being assembled in advance during the manufacturing process. When assembling the whole lighting apparatus, only the soldering of the plug pin 3 and the interface board 2 are operated. So, the productivity can be improved and decrease the defective rate of a human soldering operation.

The interface board 2 is flame resistant with a material of two sides is FR-4 for two sides of the interface board 2 have to be soldered.

Please refer to FIG. 1B and FIG. 1C for an embodiment of the light source conducting connector structure 100. A surface of the light source plate 1 has a first soldering spot 121. The surface of the interface board 2 has a second soldering spot 25. The first soldering spot 121 sets on the side of the light source plate 1 facing the interface board 2. The second soldering spot 25 sets on the side of the interface board 2 facing the light source plate 1. Because the light source plate 1 and the interface board 2 are reflow soldered, the first soldering spot 121 and the second soldering spot 25 are corresponding to each other.

When reflow soldering, the first soldering spot 121 and the second soldering spot 25 are melted and connected. Meanwhile, the light source plate 1 and the interface board 2 are structurally and electrically connected. The quantity of the second soldering spot 25 and the quantity of the first soldering spot 121 are the same. The quantity of the first soldering spot 121 is decided by the function and model of the light source plate 1. For example, the quantity of the first soldering spot 121 is two and outputted in a single path. The quantity of the first soldering spot 121 is four and outputted in two paths. The quantity of the first soldering spot 121 is six and outputted in three paths. Here, the exact position of each first soldering spot 121 is not limited.

Please refer to FIG. 1B for an embodiment of the light source conducting connector structure 100. The interface board 2 and the light source plate are set layer by layer. The light source plate 1 has a base substrate 12 and a light emitting portion 11 sets on the base substrate 12. The light emitting portion 11 is capable of being an integrated light emitting chip. The first soldering spot 121 sets on the surface of the base substrate 12. The surface of the base substrate 12 engages with the surface of the interface board 2. The first soldering spot 121 and the light emitting portion 11 set on the same side of the base substrate 12. To make the first soldering spot 121 and the second soldering spot 25 fully contact to each other, the interface board 2 has an escape hole 21. The escape hole 21 is used for escaping the light emitting portion 11. The light emitting portion 11 sets in the escape hole 21. Therefore, the corresponding sides of the interface board 2 and the light source plate 1 contact to each other. The first soldering spot 121 and the second soldering spot 25 then further engage with each other. The light emitting portion 11 is a circular disk. The escape hole 21 is correspondingly a circular shape.

Please refer to FIG. 1A and FIG. 1B for an embodiment of the light source conducting connector structure 100. The driver 4 is capable of being fixed in a driver box 5 with the screw. The light source conducting connector structure 100 has the fastener 6 used for fixing the interface board 2 and the driver box 5. The fixing of the interface board 2 and the driver box 5 enables the light source plate 1 to structurally connect with the driver box 5. Due to the interface board 2, the fastener 6 does not put force directly on the light source plate 1. Namely, the fastener 6 does not press and connect with the light source plate 1. Therefore, the light source plate 1 is prevented from deforming under force.

The interface board 2 has a first connection hole 22. The driver box 5 has a second connection hole 513. The fastener 6 passes through the first connection hole 22 and fixes in the second connection hole 513. The second connection hole 513 is a screw hole. The second connection hole 513 is capable of being a through hole or a blind hole. The fastener 6 is capable of being the screw or a bolt. A detaching end of the fastener 6 is set on one side of the interface board 2. Therefore, the fastener 6 is easy to be detached from one side of the interface board 2. The driver box 5 is near to the interface board 2; therefore, the plug pin 3 is capable of passing through the driver box 5 to the interface board 2. The way is suitable for the fixing way of the fastener 6 connecting the driver box 5 and the interface board 2.

Please refer to FIGS. 1A and 1B for an embodiment of the light source conducting connector structure 100. The driver box 5 sets successively against the light emitting direction. The light emitting portion 11 on the light source plate 1 emits light emitted through the escape hole 21 of the interface board 2. The driver box 5 sets on the side being opposite to light emitting side. The driver box 5 has a plug pin hole 511 being capable of being passed through by the plug pin 3. From the driver 4 to the interface board 2, the plug pin 3 passes through the plug pin hole 511 and the conductive hole 24 orderly. The driver box 5 has an upper box 51 and a lower box 52. The upper box 51 and the lower box 52 are capable of being connected with a buckle or the screw. The upper box 51 is set near to the interface board 2. The plug pin hole 511 and the second connection hole 513 are set on the upper box 51.

Figure 3:
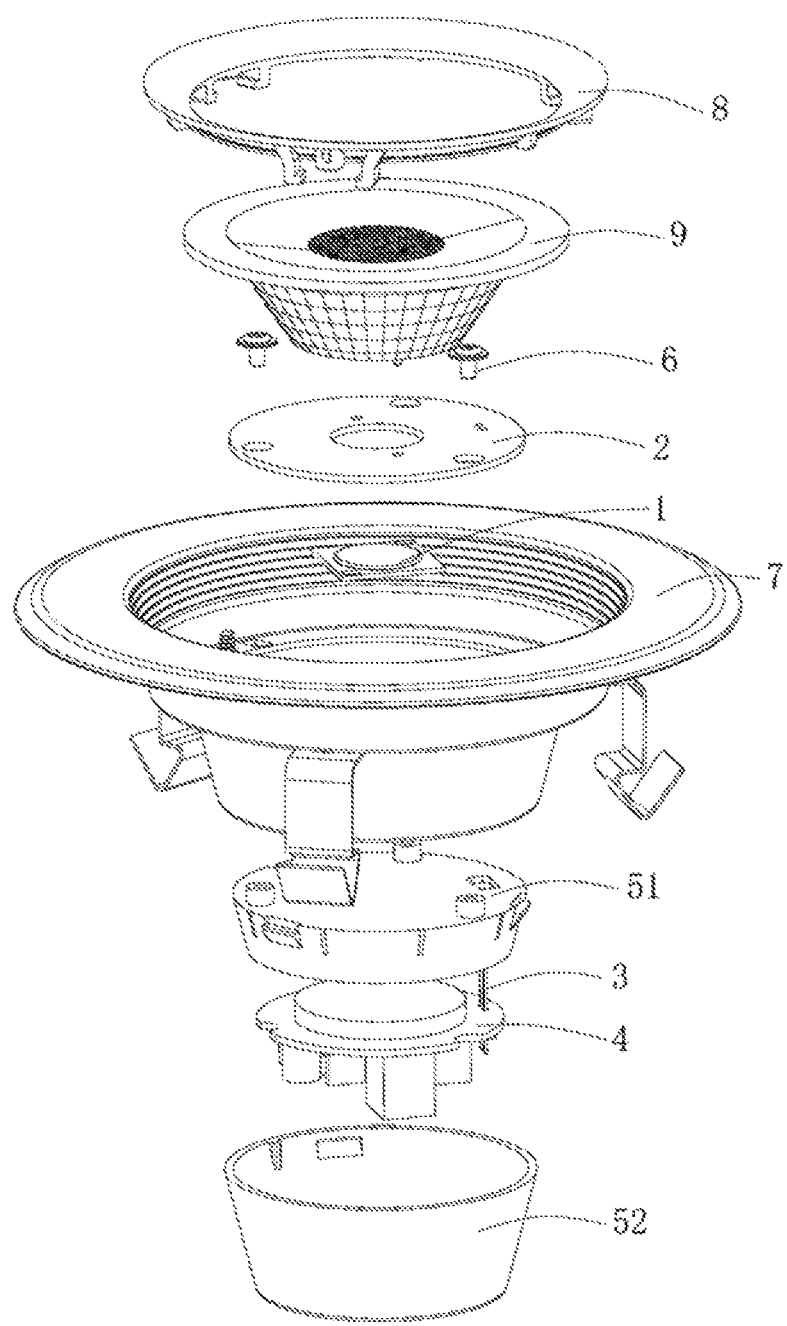
FIG. 3 illustrates an exploded view of the example in FIG. 2.

Please refer to FIG. 1B and FIG. 3 for an embodiment of the light source conducting connector structure 100. The driver box 5 has a convex platform 512 used for positioning the interface board 2. The second connection hole 513 sets in the convex platform 512. The second connection hole 513 is capable of being set through the convex platform 512 or being the blind hole. When the fastener 6 fixes the interface board 2 and the driver box 5, a head portion of the fastener 6 engages with a top portion of the convex platform 512. The convex platform 512 is capable of increasing the distance between the interface board 2 and the surface of the driver box 5, and further setting a heat sink 7 between the interface board 2 and the driver box 5. Optionally, the convex platform 512 is set through the first connection hole 22 and used for positioning the interface board 2. The interface board 2, the light source plate 1, the heat sink 7 and the driver box 5 are fastened layer by layer by the fastener 6.

Figure 2:
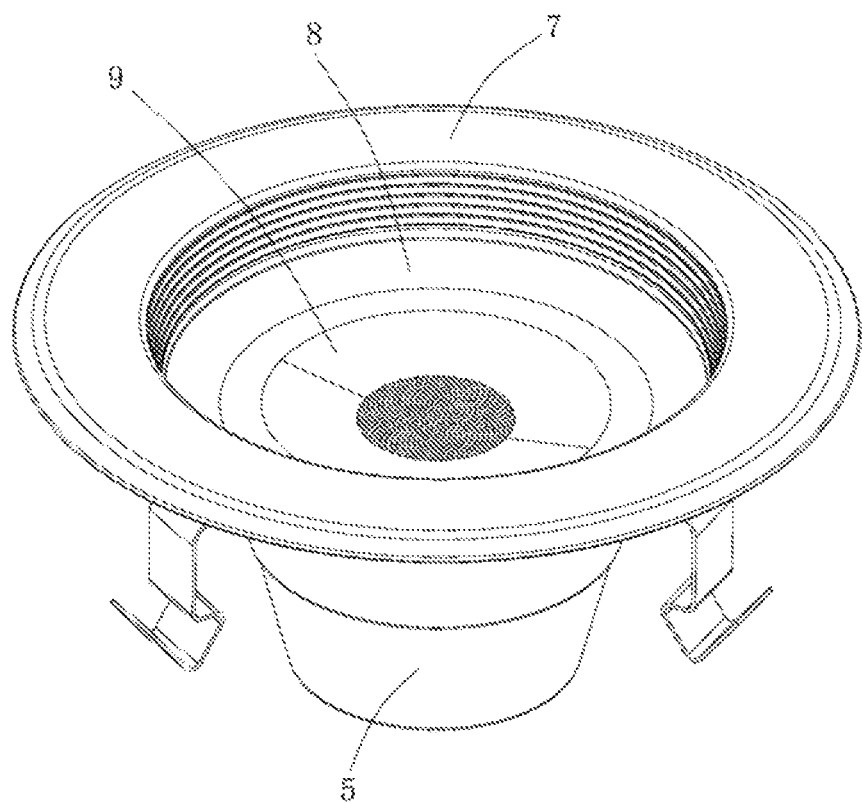
FIG. 2 illustrates a downlight apparatus example.

Please refer to FIG. 2 and FIG. 3. A lighting apparatus has the light source conducting connector structure 100 and the heat sink 7 in any of the embodiment mentioned above. The heat sink 7 is a bowl shape. A bottom portion of the heat sink 7 is clipped between the interface board 2 and the driver box 5. The interface board 2 and the light source plate 1 are set inside the heat sink 7. The driver 4 and the driver box 5 are set outside the heat sink 7. The bottom portion of the heat sink 7 has a third connection hole used for being passed through by the fastener 6. The convex platform 512 sets through the third connection hole and the first connection hole 22 to make the fastener 6 is capable of inserting into the second connection hole 513 of the convex platform 512.

The lighting apparatus provided adopts the light source conducting connector structure 100. The light source plate 1 and the driver 4 electrically connect to each other with the interface board 2 and the plug pin 3 rather than soldering the wire directly on the positive and negative ends of the light source plate 1. The light source plate 1 is reflow soldered on the interface board 2 to prevent the heat of the soldering iron damaging the light source plate 1. Also, when fixing the light source plate 1, the fastener 6 such as the screw is capable of pressing and connecting on the interface board 2 and fixing in the driver box 5 to prevent the deform of the light source plate 1.

Figure 4:
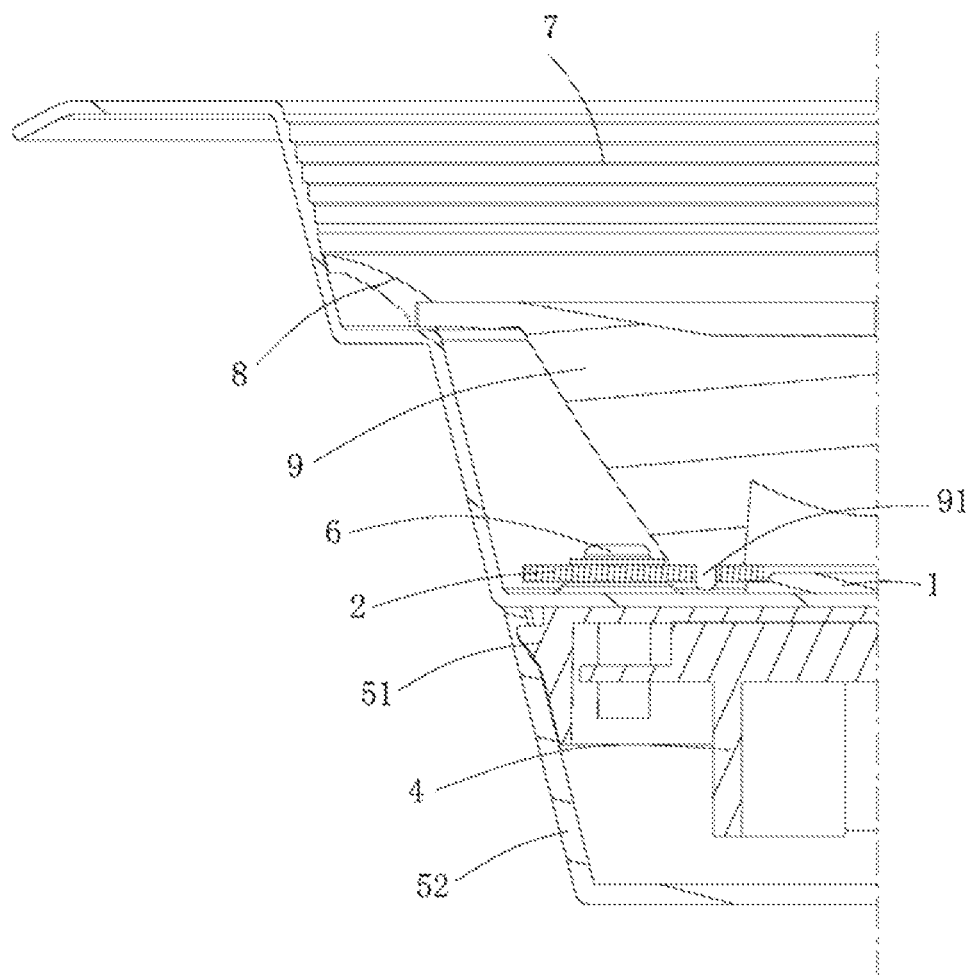
FIG. 4 illustrates a cross-sectional view of the example in FIG. 2.

Please refer to FIG. 4. The lighting apparatus has a lens module 9 and a surface rim 8 set in the heat sink 7. A protruding portion 91 facing the interface board 2 bulgingly sets on the lens module 9. The interface board 2 has a positioning hole 23 used for positioning the protruding portion 91 to make the lens module 9 positions on the interface board 2. The surface rim 8 and the het sink 7 structurally connect and make the lens module 9 press and connect between the surface rim 8 and the interface board 2.

Figure 5:
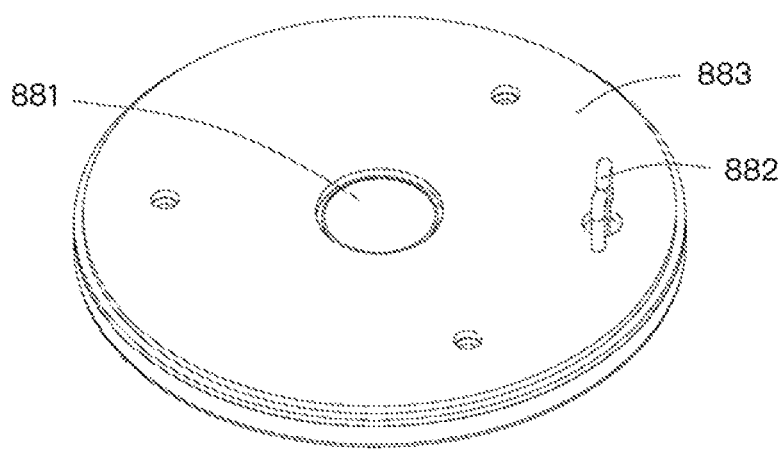
FIG. 5 illustrates a component.
Figure 6:
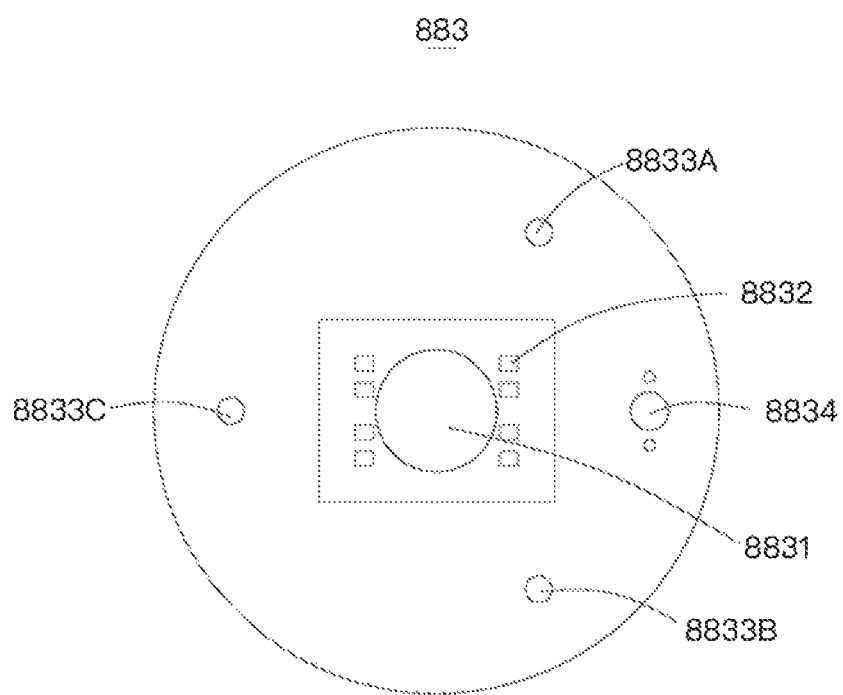
FIG. 6 illustrates another component.
Figure 7:
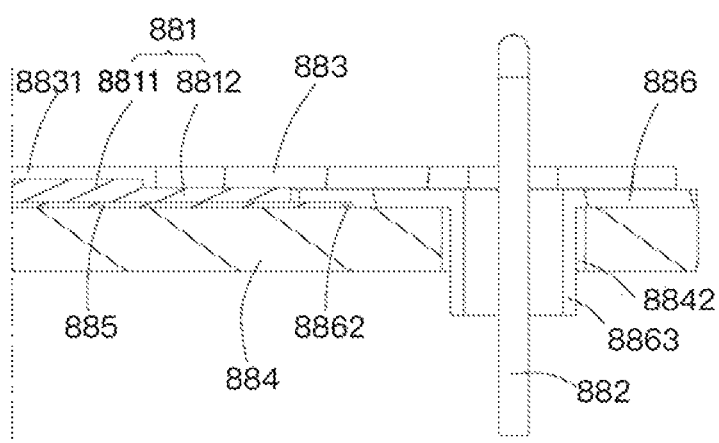
FIG. 7 illustrates a plug pin example.

Please refer to FIGS. 5, 6 and 7 for an embodiment of a light source conducting structure. The light source conducting structure has a light source plate 881, a driver 887 and an interface board 883. The light source plate 881 is reflow soldered on the interface board 883 with a reflow device. A heating device sets in the reflow device. The heating device heats the air or nitrogen to a certain temperature and blows the air or nitrogen to the light source plate 881 and the interface board 883. A solder material on the light source plate 881 and the interface board 883 is melted and connected. When there are many soldering spots on the light source plate 881, a plurality of the soldering spot on the light source plate 881 is capable of being reflow soldered on the interface board 883 simultaneously.

The interface board 883 has a conductive circuit. One end of the conductive circuit electrically connects with the light source plate 881. The other end of the conductive circuit electrically connects with the driver 887 through a wire 882. The wire 882 is soldered on the conductive circuit of the interface board 883. The interface board 883 transfers the wire 882 to make the light source plate 881 and the driver 887 electrically connect. To prevent the heat of the soldering iron damaging the light source plate 881, the wire 882 is not soldered on the soldering spot of the light source plate 881. Rather, the wire 882 is soldered only on the interface board 883. Also, the conductive circuit of the interface board 883 is capable of adjusting the quantity of an output end to reduce the quantity of the wire 882. Therefore, the efficiency of the light source conducting structure is increased.

Please refer to FIG. 6 and FIG. 7 for an embodiment of a light source conducting structure. In the light source conducting structure provided, the light source plate 881 is reflow soldered on the interface board 883 to make the light source plate 881 be fixed and electrically connected with the interface board 883. The interface board 3 has the conductive circuit. One end of the conductive circuit electrically connects with the light source plate 881. The other end of the conductive circuit electrically connects with the wire 882 of the driver 887. Therefore, the interface board 883 is capable of conducting the light source plate 881 and the driver 887. Also, an output wire is not soldered on each of the soldering spot of the light source plate 881. Rather, the wire 882 is soldered directly on the interface board 883 to increase the productivity and to prevent the damage of the light source plate 881. The light source conducting structure provided uses the wire 882 to connect the driver 887 and the interface board 883. The way is suitable when the distance between the driver 887 and the interface board 883 is longer.

Please refer to FIG. 6 for an embodiment of the light source conducting structure. The interface board 883 has a wire passing hole 8834 used for escaping the wire 882. The wire 882 passes through one side of the interface board 883 and is soldered on the other side of the interface board 883. Namely, the wire 882 is soldered on the side of the interface board 883 against the driver 887. In the lighting apparatus, the driver 887 sets on the side being opposite to light emitting side. The light source plate 881 and the interface board 883 set on the light emitting side. The assemble order is the driver 887, the light source plate 881 and the interface board 883. The wire 882 is hidden between the driver 887 and the interface board 883. In the embodiment, the wire 882 is capable of passing through the wire passing hole 8834 to the light emitting side to make the soldering easier. In another embodiment, the interface board 883 does not have the wire passing hole 8834. The wire 882 is soldered directly on the side of the interface board 883 facing the driver 887. In the embodiment, the driver 887, the light source plate 881 and the interface board 883 have to be placed in a light housing 888 after the soldering of the wire 882. Optionally, the interface board 883 has the soldering spot used for being soldered with the wire 882. The soldering spot is capable of being set near to the wire passing hole 8834 to reduce the length of the wire 882 and prevent the wire 882 from moving. The interface board 883 for two sides are soldered. Using FR-4 of two sides are for flame resistance.

Figure 8:
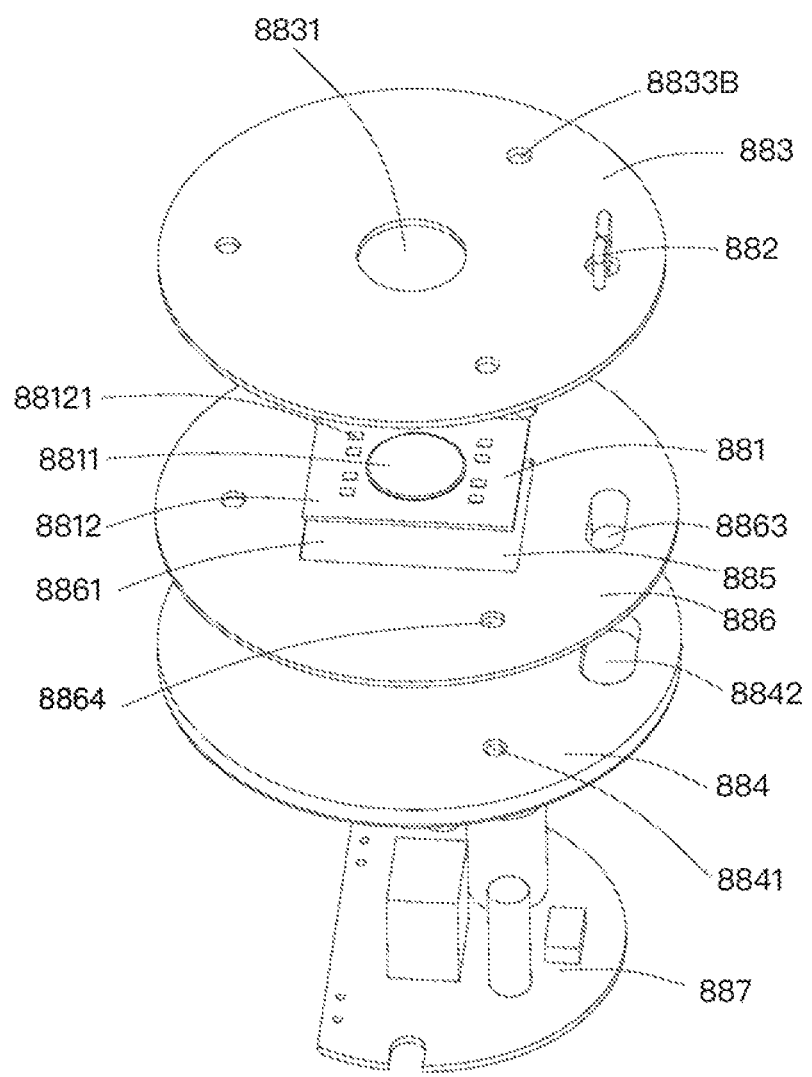
FIG. 8 illustrates components to be assembled.

Please refer to FIG. 6 and FIG. 8 for an embodiment of the light source conducting structure. A surface of the light source plate 881 has a first soldering spot 88121. The surface of the interface board 883 has a second soldering spot 8832. The first soldering spot 88121 sets on the side of the light source plate 881 facing the interface board 883. The second soldering spot 8832 sets on the side of the interface board 883 facing the light source plate 881. Because the light source plate 881 and the interface board 883 are reflow soldered, the first soldering spot 88121 and the second soldering spot 8832 are corresponding to each other. When reflow soldering, the first soldering spot 88121 and the second soldering spot 8832 are melted and connected. Meanwhile, the light source plate 881 and the interface board 883 structurally and electrically connect to each other. The quantity of the second soldering spot 8832 and the quantity of the first soldering spot 88121 are same. The quantity of the first soldering spot 88121 is decided by the function and model of the light source plate 881. For example, the quantity of the first soldering spot 88121 is four and are outputted in two paths. The quantity of the first soldering spot 88121 is six and are outputted in three paths. The quantity of the first soldering spot 88121 is eight and are outputted in four paths. The exact position of each first soldering spot 88121 is not limited here.

Please refer to FIG. 8 for an embodiment of the light source conducting structure. The light source plate 881 and the interface board 883 set layer by layer. The light source plate 881 has a base substrate 8812 and a light emitting portion 8811 set on the base substrate 8812. The light emitting portion 8811 is capable of being an integrated light emitting chip. The first soldering spot 88121 sets on the surface of the base substrate 8812. The surface of the base substrate 8812 engages with the surface of the interface board 883. The first soldering spot 88121 and the light emitting portion 8811 set on the same side of the base substrate 8812. To make the first soldering spot 88121 fully contacts with the second soldering spot 8832, the interface board 883 has a light emitting escape hole 8831 used for escaping the light emitting portion 8811. The light emitting portion 8811 sets in the light emitting escape hole 8831. Therefore, the corresponding sides of the interface board 883 and the light source plate 881 contact to each other. Further, the first soldering spot 88121 engages with the second soldering spot 8832. Optionally, the light emitting portion 8811 is a circular disk. The light emitting escape hole 8831 is correspondingly a circular shape.

A light source fixing structure has the light source conducting structure. Please refer to FIG. 8 for a fixing board 884 in any of the embodiment mentioned above. The interface board 883 is fixed on the fixing board 884. The light source plate 881 is further fixed on the fixing board 884. In the light source fixing structure, a fastener is capable of being connected on the interface board 883 rather than directly putting force on the light source plate 881. Therefore, the light source plate 881 is prevented from warping deformation. The light source fixing structure has the light source conducting structure. The wire 882 is capable of being directly soldered on the interface board 883 to conduct the light source plate 881 and the driver 887 without damaging the light source plate 881. The way is suitable when the distance between the driver 887 and the interface board 883 is longer.

Please refer to FIG. 8 for an embodiment of the light source fixing structure. The light source fixing structure has the fastener used for fixing the interface board 883 and the fixing board 884. More particularly, the interface board 883, the light source plate 881 and the fixing board 884 orderly set layer by layer. When the interface board 883 and the fixing board 884 structurally connect, the light source plate 881 is clipped to fix between the interface board 883 and the fixing board 884. The interface board 883 has a first connection hole 8833A. The fixing board 884 has a second connection hole 8841. The light source plate 881 is smaller than the interface board 883. When the fastener passes through the first connection hole 8833A and the second connection hole 8841, the fastener does not pass through the light source plate 881. Optionally, the connection hole 8833A is a through hole. The second connection hole 8841 is a screw hole. The fastener passes through the through hole and connects with the screw hole. The fastener is capable of being detached from one side of the interface board 883 to make the operation and assembly easier.

Please refer to FIG. 7 and FIG. 8 for an embodiment of the light source fixing structure. The fixing board 884 is a metal heat dissipation board. The interface board 883 is fixed on the fixing board 884. The light source plate 881 engages with the fixing board 884, making the heat generated by the light source plate 881 is capable of being dissipated through the fixing board 884 and to prevent the heat being on the light source plate 881. The light source fixing structure has a heat conductive insulation pad 885 clipped between the light source plate 881 and the fixing board 884. The heat conductive insulation pad 885 is capable of being a heat conductive insulation rubber sheet, heat conductive insulation silicon sheet. Because the metal heat dissipation board is conductive, the heat conductive insulation pad 885 is capable of insulating the light source plate 881 from the metal heat dissipation board. Therefore, the heat is capable of being conducted without causing short circuit. When the light source plate 881 is a high voltage COB light source, an indoor electricity is outputted in multi-path after being inputted and adjusted by the circuit. But an output voltage is not a safe low voltage but a high voltage output. The heat conductive insulation pad 885 is capable of bearing the voltage and prevent an electric creepage.

Please refer to FIG. 7 and FIG. 8 for an embodiment of the light source fixing structure. The light source fixing structure has an insulation sheet 886 clipped between the interface board 883 and the fixing board 884. The insulation sheet 886 is capable of preventing the electric creepage. The insulation sheet 886 is made of insulation material and is capable of being a plastic sheet, a silicon sheet or a rubber sheet. The insulation sheet 886 has a light source escape hole 8861 used for escaping the light source plate 881. The light source plate 881 sets in the light source escape hole 8861; therefor, two sides of the insulation sheet 886 engages respectively with the interface board 883 and the fixing board 884. So, the interface board 883 is insulated from the fixing board 884, and the interface board 883 is supported. The insulation sheet 886 extends to the rim of the interface board 883 to support every portion of the interface board 883. The wire 882 orderly passes through the fixing board 884, the insulation sheet 886 and the interface board 883 and is soldered on the interface board 883. The fixing board 884 has a board hole 8842 used for being passed through by the wire 882. A thin wall tube 8863 bulgingly sets on the insulation sheet 886 and faces to the inner part of the board hole 8842. The wire 882 is isolated from an inner wall of the board hole 8842 of the fixing board 884 to prevent the short circuit. Further, when the interface board 883 and the fixing board 884 are fixed by the fastener, the fastener orderly passes through the first connection hole 8833A of the interface board 883, a third connection hole 8864 of the insulation sheet 886 and the second connection hole 8841 of the fixing board 884.

Please refer to FIG. 7 and FIG. 8 for an embodiment of the light source fixing structure. The area of the heat conductive insulation pad 885 is bigger than the area of the light source plate 881. The rim of the heat conductive insulation pad 885 extends to the between of the insulation sheet 886 and the fixing board 884. Therefore, the heat conductive insulation pad 885 hides the light source escape hole 8861 and prevents an electric leakage from the inner wall of the light source escape hole 8861. Correspondingly, the side of the insulation sheet 886 facing the fixing board 884 has a pad groove 8862. The pad groove 8862 make the insulation pad 885 extend to the between of the insulation sheet 886 and the fixing board 884, rather than heat conductive insulation pad 885 topping up the insulation sheet 886.

A lighting apparatus is provided. The lighting apparatus has the light source fixing structure in any of the embodiment mentioned above.

Figure 9:
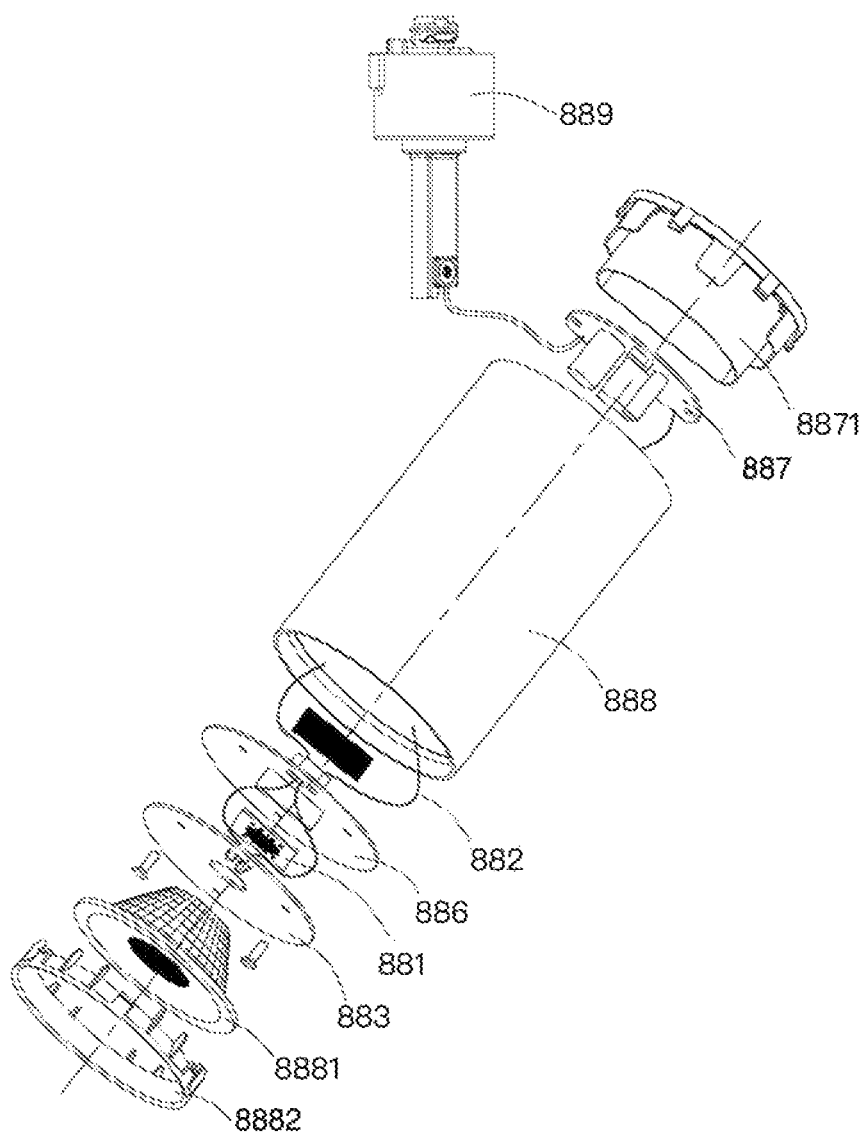
FIG. 9 illustrates another lighting apparatus example.
Figure 10:
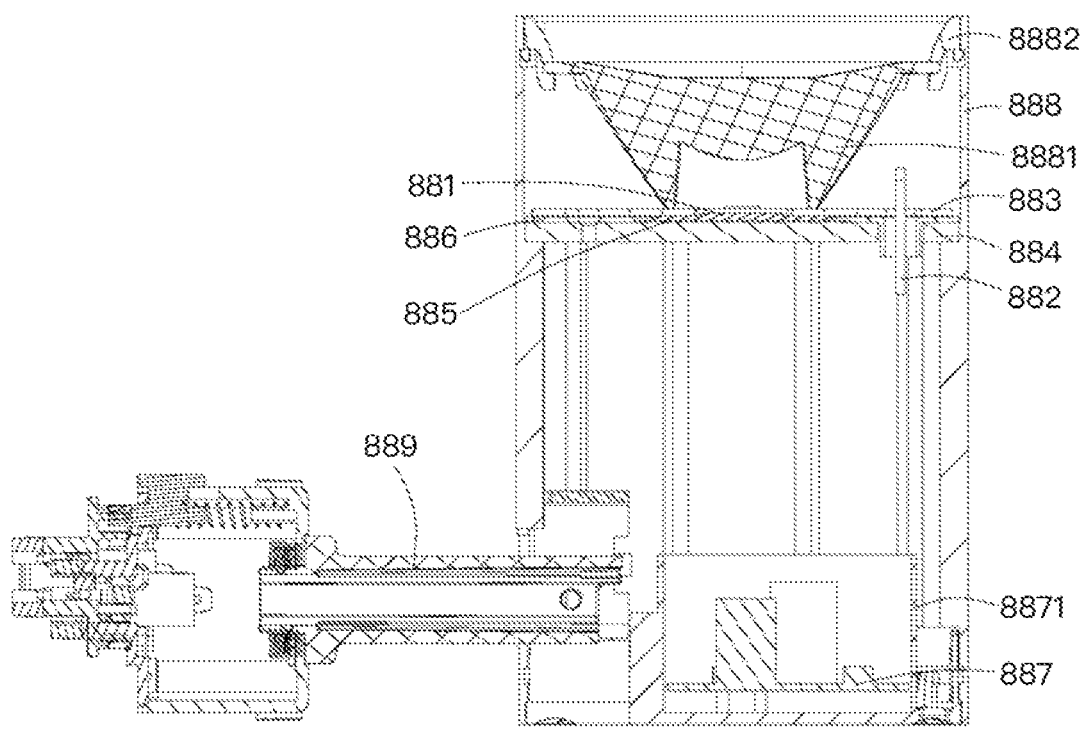
FIG. 10 illustrates a cross-sectional view of the example in FIG. 9.

Please refer to FIG. 9 and FIG. 10 for an embodiment of the lighting apparatus. The embodiment has the lighting apparatus 8882 and a power socket 889. The light source fixing structure, a lens module 8881 and a surface rim 8882 set in the light housing 888. The interface board 883 and the driver 887 respectively set on the corresponding two sides of the light housing 888. The distance between the interface board 883 and the driver 887 is longer. The interface board 883 and the driver 887 are connected by the wire 882. The driver 887 sets in a driver box 8871. The driver box 8871 structurally connect with the light housing 888. The power socket 889 plugs with the indoor electricity to get power and electrically connects with the driver 887. The lens module 8881 covers the light source plate 1 to increase the luminance efficiency of the light. The surface rim 8882 fixes in the light housing 888 and presses the lens module 8881 on the interface board 883.

Figure 11:
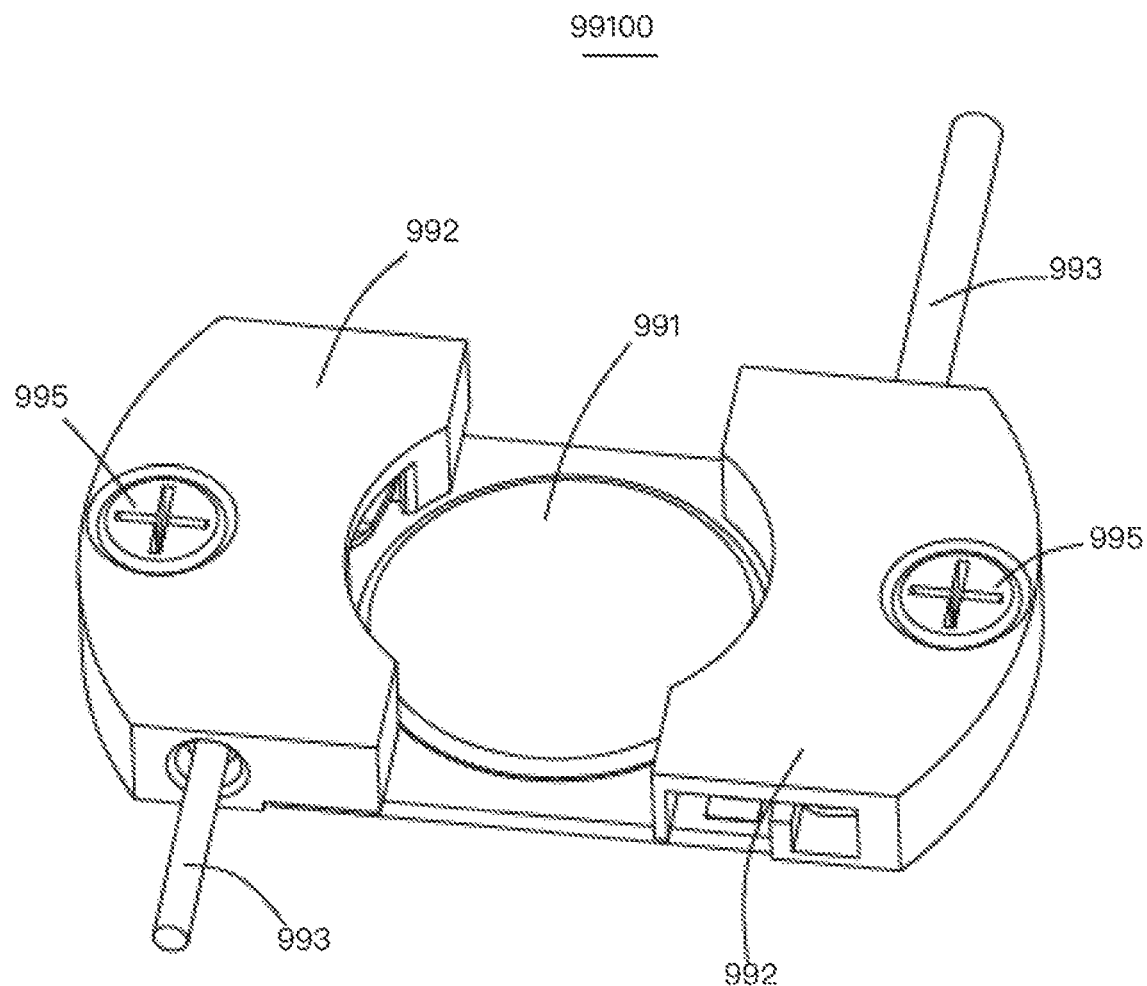
FIG. 11 shows a top portion example.
Figure 12:
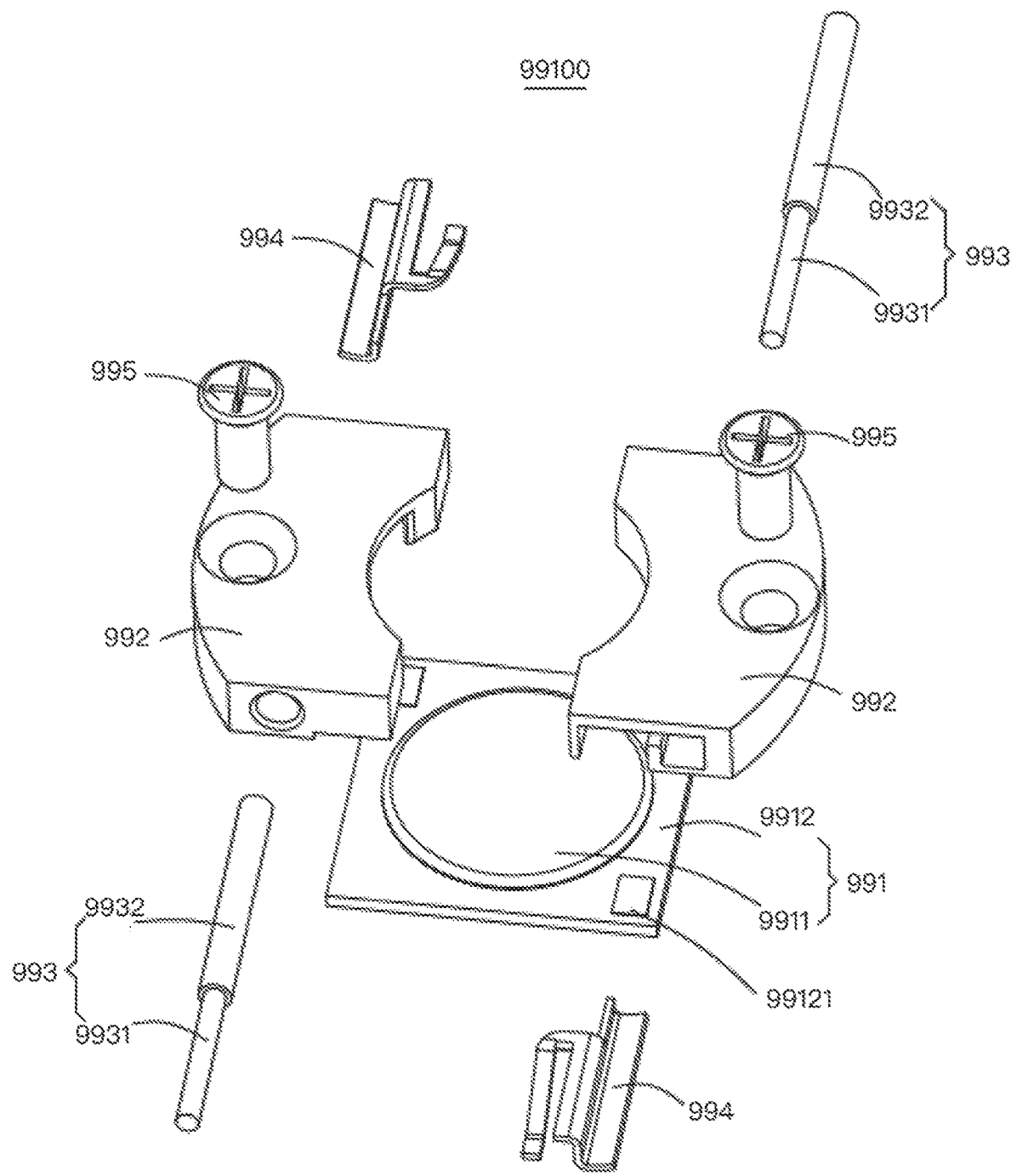
FIG. 12 shows an exploded view of components in the example of FIG. 11.

Please refer to FIG. 11 and FIG. 12 for an embodiment of a light source connector structure 99100. The light source connector structure 99100 has a light source plate 991, a pressing block 992, an elastic clip 994, a wire 993 and a fastener 995. The surface of the light source plate 991 has a conductive portion 99121. The press block 992 has an elastic clip hole 99201 and a wire hole 99202. The elastic clip 994 is capable of inserting into the elastic clip hole 99201. The wire 993 is capable of inserting into the wire hole 99202. Because the elastic clip hole 99201 and the wire hole 99202 are connected, the wire 993 inserting into one end of the wire hole 99202. The wire 993 is capable of extending and inserting into the elastic clip hole 99201. Therefore, the wire 993 and the elastic clip 994 set layer by layer and contact to each other. Further, the wire 993 and the elastic clip 994 conduct each other. The elastic clip 994 is elastic and well engages on the conductive portion 99121. One end of the wire 993 conducts the elastic clip 994. The other end of the wire 993 is used for connecting a driver 996 to make the driver 996 conduct the conductive portion 99121 of the light source plate 991. Further, the fastener 995 is used for fastening the pressing block 992 and the light source plate 991. The pressing block 992 and the light source plate 991 press to each other. The pressing block 992 slightly deforms to make the wire 993 fully contact with the elastic clip 994. The fastener 995 is capable of pressing and connecting the wire 993 and the elastic clip 994 to each other. Also, the fastener 995 is capable of fastening the pressing bloc 992 and the light source plate 991. More particularly, the fastener 995 is capable of fastening the pressing block 992 on a fixing unit 997 of a lighting apparatus 99300. The light source plate 991 is clipped between the pressing block 992 and the fixing unit 997. The fastener 995 directly puts force on the pressing block 992 and the fixing unit 997 without deforming the light source plate 991.

In the light source connector structure 99100 provided, the pressing block 992 has the elastic clip hole 99201 and the wire hole 99202. The elastic clip hole 99201 and the wire hole 99202 are connected. The elastic clip 994 and the wire 993 respectively insert into the elastic clip hole 99201 and the wire hole 99202. The elastic clip 994 and the wire 993 contact to each other. The elastic clip 994 engages with the conductive portion 99121 of the light source plate 991. Therefore, the conductive portion 99121 of the light source plate 991 is capable of conducting the wire 993 through the elastic clip 994. Further, the light source plate 991 electrically connects with the driver 996. When the fastener 995 fastens the pressing block 992 and the light source plate 991, the fastener 995 is capable of fastening on the pressing block 992 without having direct force on the light source plate 991; therefore, the light source plate 991 is prevented from deforming. When the pressing block 992 is fastened with the light source plate 991, the pressing block 992 deforms under force. The wire 993 fully contacts the elastic clip 994 to guarantee the stable conduction of the light source plate 991 and the wire 993. In the light source connector structure 99100, an output wire is not soldered on the conductive portion 99121 of the light source plate 991. Therefore, the light source is not damaged. A light source bracket is not needed, and the molding cost is further saved. The design and assembly problem using the light source bracket is also prevented.

Please refer to FIG. 12 for an embodiment of the light source plate 991. The light source plate 991 has a base substrate 9912 and a light emitting portion 9911 of the base substrate 9912. The light emitting portion 9911 is capable of being a light emitting chip. The light emitting chip is integrated on the base substrate 9912. The conductive portion 99121 sets on the surface of the base substrate 9912. The conductive portion 99121 electrically connects with the light emitting portion 9911 through an inner circuit of the base substrate 9912. Optionally, the conductive portion 99121 is capable of being a conductive structure, such as a soldering spot, a soldering point or a conductive column. The quantity of the conductive portion 99121 is capable of being two, four, six, and so on. The exact position of the conductive portion 99121 is not limited here. For example, the quantity of the conductive portion 99121 is two and respectively sets on the upper left corner and the lower right corner of the base substrate 9912. The quantity of the conductive portion 99121 is four and are outputted in two paths. Two of the conductive portions 99121 set on the left side of the base substrate 9912 while the other two set on the right side of the base substrate 9912. Optionally, the conductive portion 99121 and the light emitting portion 9911 set on the same side of the base substrate 9912. The pressing block 992 sets on the same side of the base substrate 9912. The fastener 995 is capable of being detached and assembled from the side of the base substrate 9912.

Figure 13:
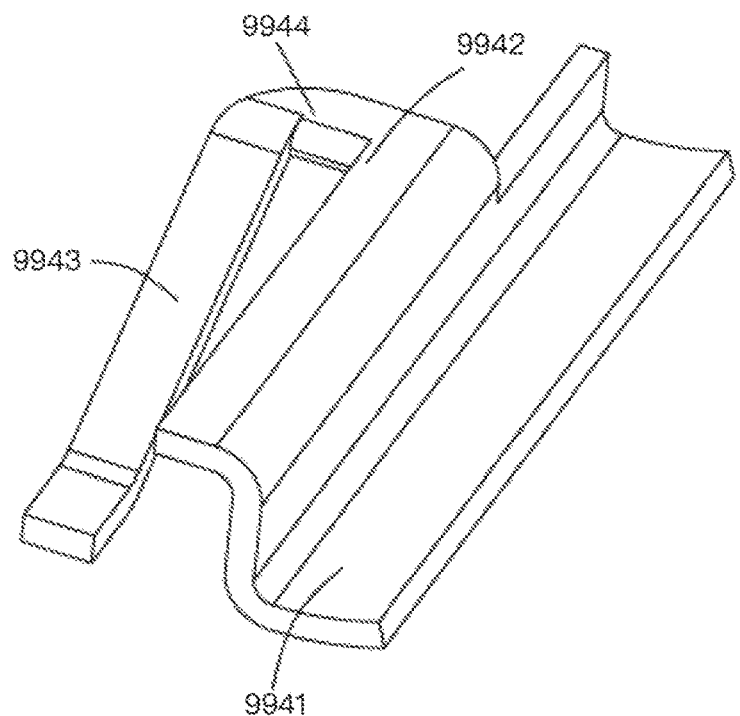
FIG. 13 shows a component used in FIG. 11.

Please refer to FIG. 13 for an embodiment of the elastic clip 994. The elastic clip 994 has a plugging portion 9941, an elastic portion 9943 and a transition portion 9942. Two sides of the transition portion 9942 respectively connect the plugging portion 9941 and the elastic portion 9943. The plugging portion 9941 is plugged in the elastic clip hole 99201. The plugging portion 9941 conducts with the wire 993. The elastic portion 9943 is elastic. The elastic portion 9943 is pressed and connected on the conductive portion 99121. The elastic portion 9943 conducts with the conductive portion 99121. The transition portion 9942 is a transition and connection portion of the plugging portion 9941 and the elastic portion 9943. Optionally, the plugging portion 9941 sets in the elastic clip hole 99201. The transition portion 9942 sets through a lateral wall of the elastic clip hole 99201 to make the elastic portion 9943 sets on the elastic clip hole 99201. The elastic clip 994 is made of conductive material and is capable of being a copper elastic clip, an aluminum elastic clip, and so on, to guarantee the conductive function.

Please refer to FIG. 13 for an embodiment of the elastic clip 994. The length of the plugging portion 9941 is longer than the length of the transition portion 9942. Because the plugging portion 9941 has to contact with the plugging portion 9941 of the elastic clip 994, the length of the plugging portion 9941 is longer. The transition portion 9942 is used for connecting the elastic portion 9943 and the plugging portion 9941. The length of the transition portion 9942 is shorter to save the material and to prevent the transition portion 9942 from deforming. So, the transition portion 9942 is capable of inserting into the pressing block 992 easily.

Please refer to FIG. 13 for an embodiment of the elastic clip 994. The transition portion 9942 and the elastic portion 9943 bent and connect to form a U-shape portion 9943. One lateral wall of the U-shape portion 9943 is the transition portion 9942. The other lateral wall of the U-shape portion 9943 is the elastic portion 9943. A bottom portion of the U-shape portion 9943 is a bent junction of the transition portion 9942 and the elastic portion 9943. An opening of the U-shape portion 9943 faces to an outer part of the pressing block 992 to make the elastic portion 9943 extend from a head to a tail gradually toward the outer part of the pressing block 992 along the plugging direction of the elastic clip 994. Namely, the bent junction of the transition portion 9942 and the elastic portion 9943 is in the pressing block 992. The pressing block 992 is capable of protecting the bent junction of the transition portion 9942 and the elastic portion 9943 to extend the lifespan of the elastic clip 994. More particularly, the elastic portion 9943 gradually aslant extends from the transition portion 9942 to the outer part of the pressing block 992 until the elastic portion 9943 engages with the conductive portion 99121. When assembling, even though the light source plate 991 is uneven, the elastic portion 9943 is capable of inserting into the pressing block 992 under the pressure function of a self-elasticity and outside protrusion. Namely, the elastic portion 9943 does not deadly lock on the light source plate 991.

Figure 14:
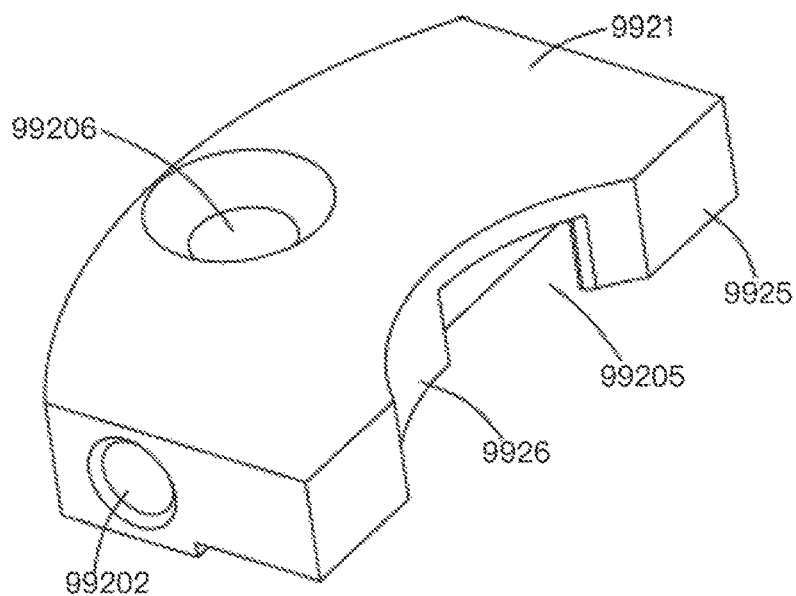
FIG. 14 shows another component used in FIG. 11.
Figure 15:
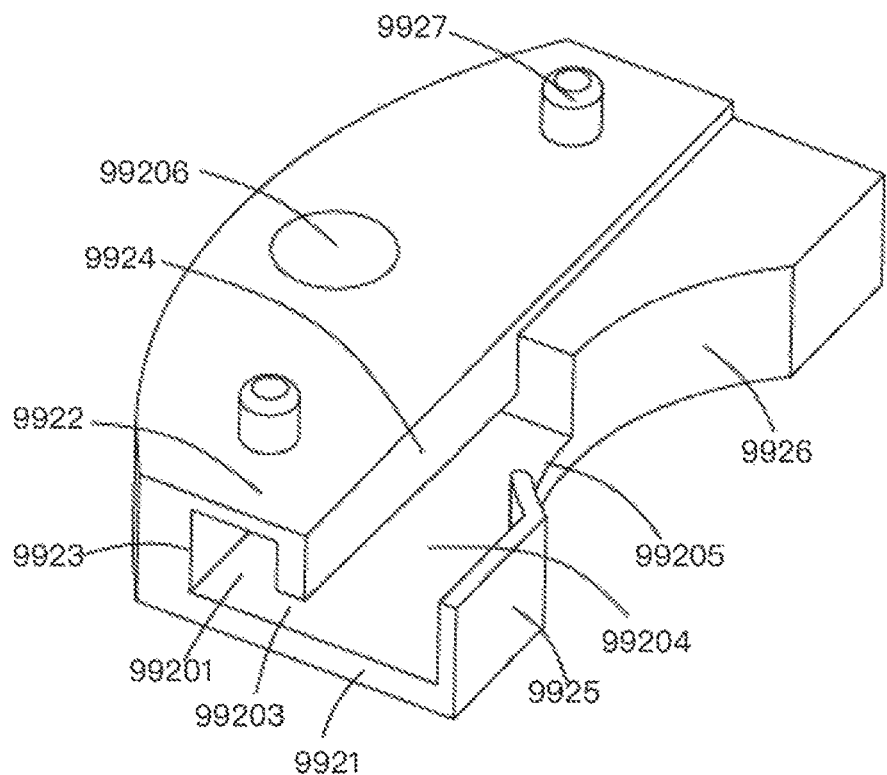
FIG. 15 shows another component used in FIG. 11.

Please refer to FIG. 14 and FIG. 15 for an embodiment of the pressing block 992. The pressing block 992 has a bottom wall 9922, a top wall 9921, a first lateral wall 9923 and a second lateral wall 9924. The bottom wall 9922 is near the light source plate 991. The top wall 9921 is far from the light source plate 991. The first lateral wall 9923 connects the bottom wall 9922 and the top wall 9921. The second lateral wall 9924 is formed by extending from the bottom wall 9922 to the top wall 9921. The top wall 9921, the bottom wall 9922, the first lateral wall 9923 and the second lateral wall 9924 together enclose to form the elastic clip hole 99201. More particularly, the plugging portion 9941 of the elastic clip 994 inserts into the elastic clip hole 99201. The elastic portion 9943 of the elastic clip 994 sets outside of the elastic clip hole 99201 to make the elastic portion 9943 is capable of being pressed and connected on the conductive portion 99121. Optionally, the elastic clip hole 99201 is a rectangular shape. A cross section profile of the plugging portion 9941 inserting in the elastic clip hole 99201 is capable of being a L-shape, a U-shape, the rectangular shape, and so on. The shape of an inner wall or part of the inner wall of the plugging portion 9941 and the elastic clip hole 99201 are same to make the plugging portion 9941 fits in the elastic clip hole 99201. Further, the bottom wall 9922 and the top wall 9921 are paralleled, and the first lateral wall 9923 and the second lateral wall 9924 are paralleled to make the elastic clip hole 99201 be rectangular. The elastic clip hole 29901 is also capable of being a circular shape. The cross-section profile of the plugging portion 9941 inserting in the elastic clip hole 99201 is capable of being an arc shape, a circular ring or a solid circular shape to fit in the shape of the elastic clip hole 99201. Correspondingly, the top wall 9921, the bottom wall 9922, the first lateral wall 9923 and the second lateral wall 9924 enclose to form the circular shape. The elastic clip hole 99201 is capable of being an oval or a polygon. The corresponding position and shape of the top wall 9921, the bottom wall 9922, the first lateral wall 9923 and the second lateral wall 9924 changes according to the shape of the elastic clip hole 99201.

Please refer to FIG. 15 for an embodiment of the pressing block 992. A first gap portion 99203 is between a top portion of the second lateral wall 9924 and the top wall 9921. The transition portion 9942 sets in the first gap portion 99203. The side of the second lateral wall 9924 facing the top wall 9921 is the top portion of the second lateral wall 9924. The side of the second lateral wall 9924 facing the bottom wall 9922 is the bottom portion of the second lateral wall 9924. In the embodiment, a gap, namely the first gap portion 99203, is between the top portion of the second lateral wall 9924 and the top wall 9921. The first gap portion 99203 is the opening of the elastic clip hole 99201. The first gap portion 99203 makes the elastic clip hole 99201 be semi-closed. The transition portion 9942 sets at the first gap portion 203. When the plugging portion 9941 and the elastic portion 9943 are connecting, the elastic clip hole 99201 is still semi-closed. The plugging portion 9941, the transition portion 9942 and the elastic portion 9943 are formed as an unibody. With inserting the elastic clip 994, the plugging portion 9941 inserts in the elastic clip hole 99201. The transition portion 9942 inserts in the first gap portion 99203 and the elastic portion 9943 inserts in a containing groove 99204 of the elastic portion 9943. The distance between the top portion of the second lateral wall 9924 and the top wall 9921 is not limited here. The distance has to be larger than the thickness of the transition portion 9942 to enable the insertion of the elastic clip 994. In the embodiment, when the cross-section profile of the plugging portion 9941 is L-shape, the transition portion 9942 and the plugging portion 9941 connect to form a Z-shape to make the transition portion 9942 connect with the elastic portion 9943.

Optionally, the second lateral wall 9924 is capable of being formed by extending from the top wall 9921 to the bottom wall 9922. The gap is between the bottom wall 9922 of the second lateral wall 9922. The transition portion 9942 sets at the gap. Namely, the transition portion 9942 is near the light source plate 991. In the embodiment, the elastic portion 9943 has to extend from the transition portion 9942 to the top wall 9921, then extend to the conductive portion 99121 of the light source plate 991. Therefore, the elastic portion 9943 has enough place to guarantee the enough press force between the conductive portion 99121 and the elastic portion 9943.

Please refer to FIG. 15 for an embodiment of the pressing block 992. The pressing block 992 has a third lateral wall 9925 extending from the top wall 9921 to the bottom wall 9922. The second lateral wall 9924, the third lateral wall 9925, the top wall 9921 and the light source plate 991 form the containing groove 99204. The groove 99204 is used for containing the elastic portion 9943. The third lateral wall 9925 is capable of covering the elastic portion 9943 to prevent the collision and deformation of the elastic portion 9943 and other portion in the lighting apparatus 99300. A second gap portion 99207 is between the bottom portion of the third lateral wall 9925 and the light source plate 991. The second gap portion 99207 make the third lateral wall 9925 and the light source plate 991 do not interfere each other. Further, the deformability of the elastic portion 9943 is not influenced by the manufacturing. The elastic portion 9943 is capable of fully contacting to the conductive portion 99121. In another embodiment, the pressing block 992 does not have the third lateral wall 9925. The second lateral wall 9924, the top wall 9921 and the light source plate 991 form the containing groove 99204 to protect the elastic portion 9943.

Please refer to FIG. 14 and FIG. 15 for an embodiment of the pressing block 992. The wire hole 99202 and the elastic clip hole 99201 respectively set on the two ends of the pressing block 992 to form an opposite plugging direction of the elastic clip 994 and the wire 993. Therefore, the plugging portion 9941 of the elastic clip 994 and the wire 993 are capable of contacting and overlapping at the wire hole 99202 or in the elastic clip hole 99201. In the opposite plugging direction, the plugging portion 9941 and the wire 993 are easier to contact and overlap. The contact area and the conductivity of the plugging portion 9941 and the wire 993 are better.

Further, when the plugging directions of the elastic clip 994 and the wire 993 are opposite, a projection of the elastic clip hole 99201 along the plugging direction of the elastic clip 994 covers the projection of the wire hole 99202 along the plugging direction of the elastic clip 994. Namely, a cross section of the elastic clip hole 99201 is bigger than the cross section of the wire hole 99202. Therefore, when the wire 993 inserts into the wire hole 99202 and extends to the elastic clip hole 99201, the inserting route of the wire 993 is in the area of the elastic clip hole 99201. So, the plugging portion 9941 of the elastic clip 994 is capable of contacting or covering the wire 993 to prevent the wire 993 and the elastic clip 994 interfering each other when plugging. Optionally, the wire hole 99202 is the circular shape. Because the cross-section profile of the wire 993 is the circular shape, the circular wire hole 99202 is more suitable for ordinary wire 993. The elastic clip hole 99210 is circular or rectangular.

In another embodiment of the pressing block 992, the plugging direction of the elastic clip 994 intersects with the plugging direction of the wire 993. So, the plugging portion 9941 of the elastic clip 994 intersects with the wire 993 to make the plugging portion 9941 is capable of contacting to the wire 993 in the pressing block 992. The intersect angle of the plugging directions of the elastic clip 994 and the wire 993 is not limited here. Optionally, the interact angle is capable of being 60°, 90° or 120°.

Please refer to FIG. 14 for an embodiment of the pressing block 992. The inner wall of the wire hole 99202 has a ring ladder. The ring ladder divides the wire hole 99202 into two segments. The segment being near to the elastic clip hole 99201 is a first hole segment. The segment being near to the outside of a pressing and connecting block is a second hole segment. The diameter of the first hole segment is shorter than the diameter of the second hole segment. The wire 993 has a conductive core 9931 and an insulation skin 9932. The insulation skin 9932 of the end of the wire 993 inserting into the wire hole 99202 is stripped. Therefore, the conductive core 9931 exposes and conducts with the plugging portion 9941. The conductive core 9931 inserts into the first hole segment. The wire 993 in the second hole segment has the insulation skin 9932. The ring ladder is capable of stopping the insulation skin 9932 and further positioning the wire 993 to control the length of the conductive core 9931 inserting into the first hole segment.

Please refer to FIG. 14 and FIG. 15 for an embodiment of the pressing block 992. An escape portion 9926 concavely sets on the side of the pressing block 992 facing the light emitting portion 9911. The escape portion 9926 is used for escaping the light emitting portion 9911 and preventing the light emitting portion 9911 from being hidden by the pressing block 992. More particularly, the light emitting portion 9911 is circular. The escape portion 9926 is an arc shape and sets correspondingly to the shape of the light emitting portion 9911. Further, the lateral wall of the escape portion 9926 has an opening 99205 connecting with the containing groove 99204. The opening 99205 is capable of simplifying the structure of the pressing block 992 for easy injection molding and preventing the interference of the elastic portion 9943 of the elastic clip 994 and the third lateral wall 9925. Therefore, the elastic clip 994 is capable of engaging to the conductive portion 99121 in smaller containing groove 99204 of the elastic portion 9943.

Please refer to FIG. 14 and FIG. 15 for an embodiment of the pressing block 992. A positioning portion 9927 concavely sets on the side of the pressing block 992 facing the light source plate 991. The positioning portion 9927 sets in the light source plate 991 or the fixing unit 997 of the lighting apparatus 99300. Correspondingly, a positioning hole sets on the light source plate 991 or the lighting apparatus 99300 to fit the positioning portion 9927. The positioning portion 9927 is capable of positioning the pressing block 992. The cross-section profile of the positioning portion 9927 is capable of being circular, rectangular or oval. The shape of the cross-section profile of the positioning portion 9927 is not limited here. The quantity of the positioning portion 9927 is capable of being one, two or multiple. The quantity of the positioning portion 9927 is not limited here.

Figure 16:
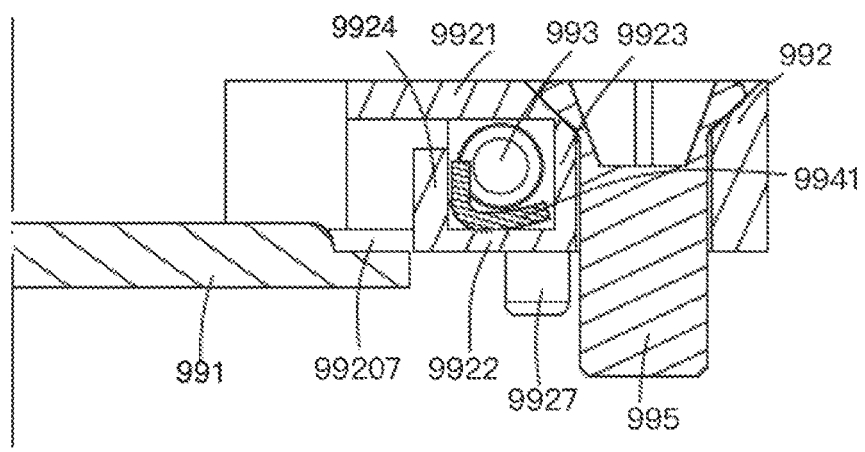
FIG. 16 shows a cross-sectional view of component connection.

Please refer to FIG. 14 to FIG. 16 for an embodiment of the pressing block 992. A first connection hole 99206 sets on the pressing block 992. A second connection hole sets on the fixing unit 997 of the lighting apparatus 99300 or other portions. The fastener 995 orderly passes through the first connection hole 99206 and the second connection hole to structurally connect the pressing block 992 and the fixing unit 997. Correspondingly, the light source plate 991 is clipped between the pressing block 992 and the fixing unit 997. Therefore, when the fastener 995 fastens the pressing block 992, the light source plate 991 and the fixing unit 997, the fastener 995 does not directly put force on the light source plate 991. Rather, the fastener 5 puts force on the pressing block 2 without damaging the light source. More particularly, the first connection hole 99206 is the through hole and sets through the pressing block 992. The second connection hole is the through hole or the blind hole. The inner wall of the second connection hole has an inner screw thread. Correspondingly, the fastener 995 is the fastener having an outer screw thread, such as screw or bolt to fit the inner screw thread of the second connection hole.

In another embodiment, the fastener is capable of being a buckle structure. The buckle structure and the pressing block 992 are formed as an unibody. Correspondingly, a buckle groove structure sets on the fixing unit 997 to fulfill a buckle connection of the pressing block 992 and the fixing unit 997. The light source plate 991 is clipped between the pressing block 992 and the fixing unit 997.

Figure 17:
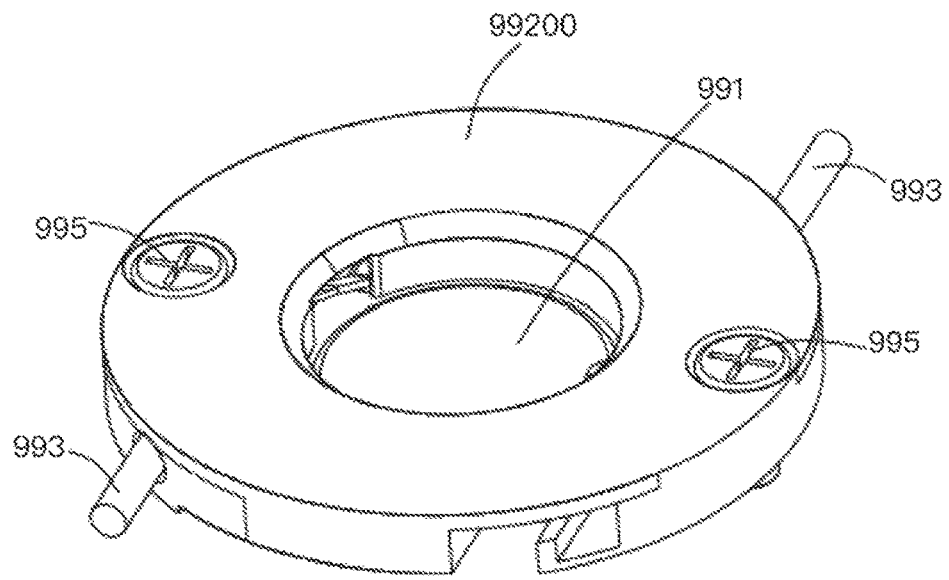
FIG. 17 shows an assembled component.
Figure 18:
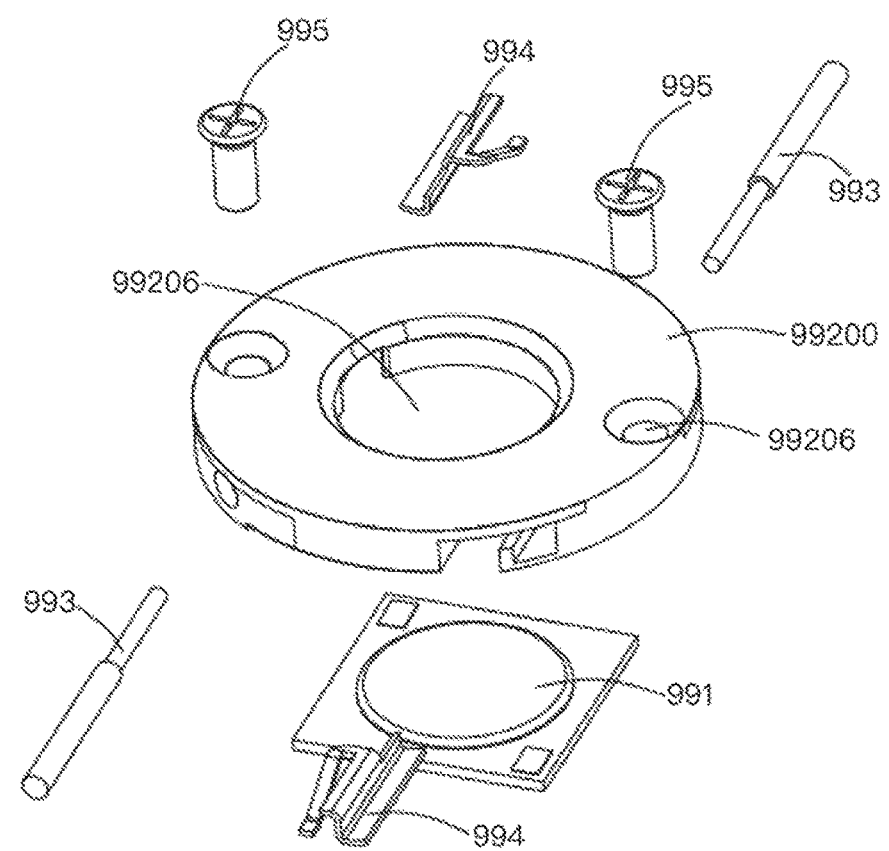
FIG. 18 shows components not assembled yet.

Please refer to FIG. 17 and FIG. 18 for one embodiment of the light source connector structure 99100. The quantity of the conductive portion 99121 is at least two. The quantity of the pressing block 992 and the conductive portion 99121 are same. Each pressing block 992 connect to each other and are formed as an unibody. Each pressing block 992 are formed as an unibody as an integrated pressing block 99200. A plurality of the elastic clip hole 99201 and the wire hole 99202 correspondingly set in the integrated pressing block 99200. Therefore, when the quantity of the conductive portion 99121 is multiple, the integrated pressing block 99200 is assembled rather than the single pressing block 992. The installation cycle and the cost of production can be reduced. Further, the integrated pressing block 99200 is capable of being circular, rectangular or polygon. The integrated pressing block 99200 has an escape hole 99260 used for escaping the light emitting portion 9911. When the light emitting portion 9911 is circular, the escape hole 99260 is circular, too.

Figure 19:
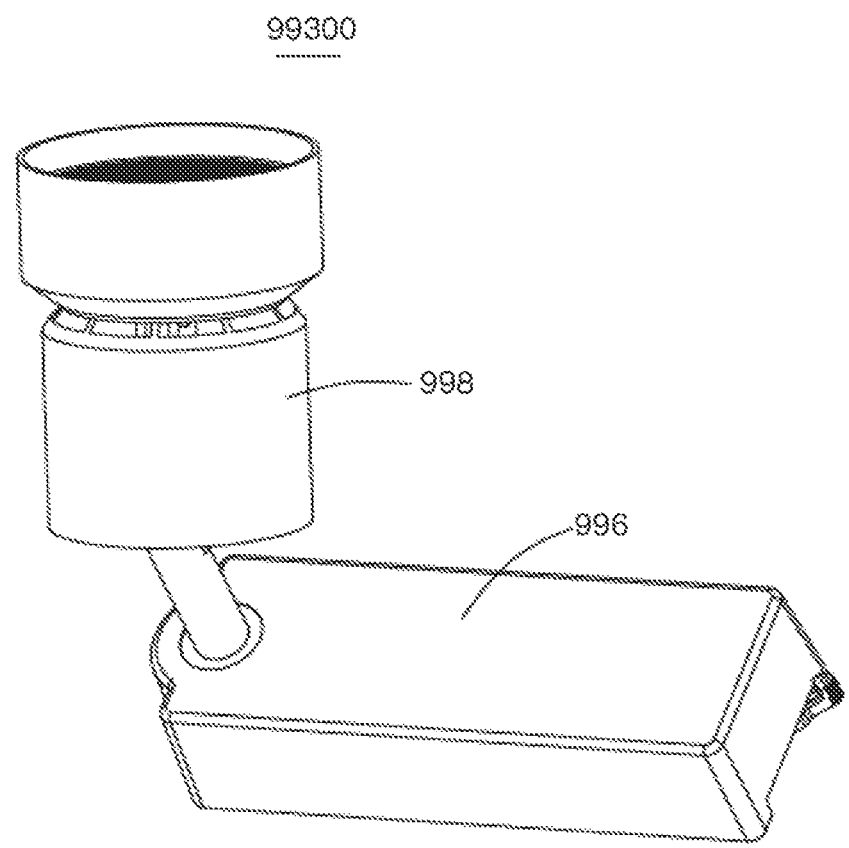
FIG. 19 shows another lighting apparatus example.
Figure 20:
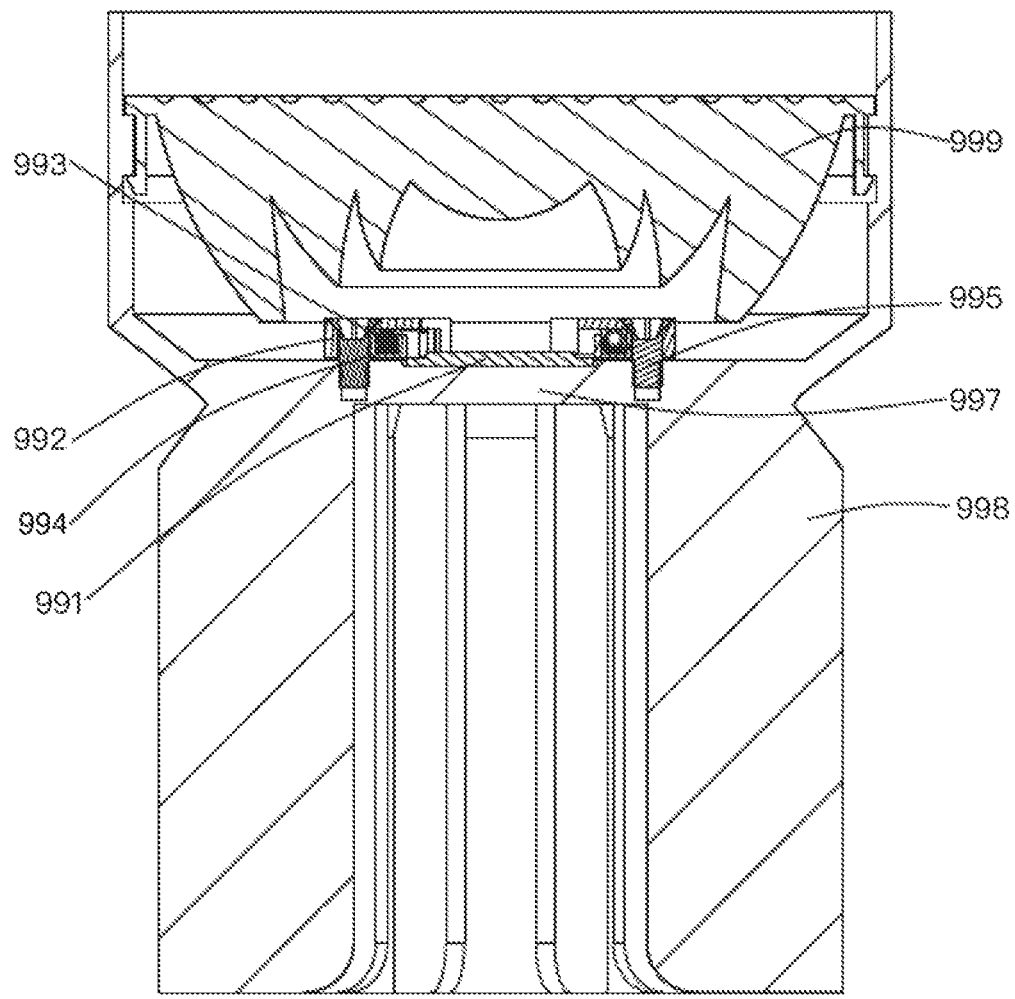
FIG. 20 shows a cross-sectional view of the example in FIG. 19.

Please refer to FIG. 19 and FIG. 20, a lighting apparatus 99300 is provided. The lighting apparatus 99300 has the light source connector structure 99100 in any of the embodiment mentioned above. The lighting apparatus 99300 also has the fixing unit 997 and the driver 996. One end of the wire 993 inserts into the wire hole 99202 of the pressing block 992. The other end of the wire 993 connects with the driver 996 to fulfill the conduction of the driver 996 and the conductive portion 99121. The fixing unit 997 structurally connects with the pressing block 992 with the fastener 995. The light source plate 991 is fixed between the fixing unit 997 and the pressing block 992.

In the light source connector structure 99100 of the lighting apparatus 99300, the conductive portion 99121 on the light source plate 991 is capable of conducting with the wire 993 through the elastic clip 994 to fulfill the electrical connection of the light source plate 991 and the driver 996. When the fastener 995 fastens the pressing block 992 and the light source plate 991, the fastener 995 is capable of putting force on the pressing block 992 without putting direct force on the light source plate 991. Therefore, the light source plate 991 is prevent from deforming. When the pressing block 992 and the light source plate 991 are fastened, the pressing block 992 deforms under force. The wire 993 fully contact to the elastic clip 994 to guarantee the stable conduction of the light source plate 199 and the wire 993. In the light source connector structure 99100, the output wire is not soldered on the conductive portion 99121 of the light source plate 991. Therefore, the light source is not damaged. Optionally, the fixing unit 997 is a heat sink. The light source plat 991 is clipped between the fixing unit 997 and the pressing block 992. The heat generated by the light source plate 991 is capable of being conducted out the lighting apparatus 99300 through the fixing unit 997 to prevent the overheat of the light source plate 991.

In one embodiment of the lighting apparatus 99300, the pressing block 992, the light source plate 991 and the fixing unit 997 set layer by layer. The second connection hole sets on the fixing unit 997 to be corresponding to the first connection hole 99206 on the pressing block 992. Therefore, the fastener 995 is capable of passing through from the first connection hole 99206 to the second connection hole and further fastening the pressing block 992 and the fixing unit 997. When the quantity of the pressing block 992 is multiple and the pressing block 992 are not formed as an unibody, each pressing block 992 has at least one first connection hole 99206 to fix the pressing block 992 and to make the wire 993 in each pressing block 992 presses and connects with the elastic clip 994. When there are multiple the pressing blocks 992 and the pressing block 992 are formed as an unibody as the integrated pressing block 99200. The quantity of the first connection hole 99206 is the same as the quantity of the conductive portion 99121. Each wire 993 and elastic clip 994 being corresponding to each conductive portion 99121 has to be fastened by one fastener 995.

Optionally, the fixing unit 997 has the positioning hole used for fitting the positioning portion 9927 on the pressing block 992. The positioning hole has the function of positioning and guiding to make the assembly of the pressing block 992 easier. When the quantity of the pressing block 992 is multiple and the pressing block 992 are not formed as an unibody, each pressing block 992 has at least two positioning portion 9927. Correspondingly, the fixing unit 997 has two positioning holes. When the quantity of the pressing block 992 is multiple and the pressing block 992 are formed as an unibody as the integrated pressing block 99200, the integrated pressing block 99200 has at least two positioning portion 9927. Correspondingly, the fixing unit 997 has two positioning holes.

In one embodiment of the lighting apparatus 99300, the lighting apparatus 99300 has a light housing 998. The fixing unit 997 is fixed in the light housing 998. The light source connector structure 99100 is fixed in the light housing 998. The driver 996 is capable of being fixed inside or outside of the light housing 998. The lighting apparatus 99300 has a lens module 999 in the light housing 998. The lens module 999 is capable of being buckle connected on the inner wall of the light housing 998. The leans module 999 sets above the light source plate 991 to make the light emitted by the lighting apparatus 99300 brighter and more even.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings.

The embodiments were chosen and described in order to best explain the principles of the techniques and their practical applications. Others skilled in the art are thereby enabled to best utilize the techniques and various embodiments with various modifications as are suited to the particular use contemplated.

Although the disclosure and examples have been fully described with reference to the accompanying drawings, it is to be noted that various changes and modifications will become apparent to those skilled in the art. Such changes and modifications are to be understood as being included within the scope of the disclosure and examples as defined by the claims.

The invention claimed is:

1. A lighting apparatus, comprising:
a driver for converting an external power to a driving current;
a light source plate having a light source and a conductive portion provided on a surface of the light source plate;
a light source connector structure having a top portion with an opening, and a bottom portion, the top portion and the bottom portion separated by a distance, the top portion further comprising an elastic clip, a pressing block having an elastic clip hole, a wire hole, a wire configured to be inserted in the wire hole, and a fastener; and
a conductive path defined between the light source and the light source connector,
wherein the light source plate is held between the top portion and the bottom portion such that light from the light source passes through the opening, and the driving current is supplied to the light source by the driver through the conductive path routed via the light source connector; and
wherein the wire and the elastic clip are in contact, the elastic clip electrically connects to the conductive portion of the light source plate, and the fastener presses and connects the wire and the elastic clip together.

2. The lighting apparatus of claim 1, wherein the fastener is fastened to the pressing block such that it applies no force on the lights source plate to prevent the light source plate to be deformed.

3. The lighting apparatus of claim 1, the light source plate comprising a substrate, a light emitting portion of the light source located at a central area of the light source plate.

4. The lighting apparatus of claim 1, wherein the conductive portion includes four conductive portions forming two conductive paths.

5. The lighting apparatus of claim 1, wherein the bottom portion of the light source connector forms a fixing unit including a heat sink.

6. The lighting apparatus of claim 1, further including a wire for carrying the driving current, wherein the top portion of the light source connector forms an interface board having a hole the wire soldered the interface board and passing through the hole, the bottom portion of the light source connector forms a fixing board, the interface board and the light source plate are both fixed to the interface fixing board.

7. The lighting apparatus of claim 6, further comprising a fastener connected to the interface board and the fixing board.

8. The lighting apparatus of claim 1, wherein the top portion of the light source connector is an interface board with a conductive hole, a plug pin passing through the conductive hole to carry the driving current to the light source plate.

9. The lighting apparatus of claim 8, wherein the driver and the plug pin are connected with a wave soldering to make the driver and the plug pin as a module.

10. The lighting apparatus of claim 8, wherein the interface board and the light source plate are fixed together as a module by a reflow soldering process.

11. The lighting apparatus of claim 1, wherein the elastic clip has a plugging portion configured to be received in the elastic clip hole, an elastic portion, and a transition portion with two sides respectively connected with the plugging portion and the elastic portion.

12. The lighting apparatus of claim 11, wherein a length of the plugging portion is longer than a length of the transition portion to prevent the transition portion deformed.

13. The lighting apparatus of claim 11, wherein the transition portion and the elastic portion form a U-shape portion, one lateral wall of the U-shape portion is the transition portion, and the other lateral wall of the U-shape portion is the elastic portion.

14. The lighting apparatus of claim 13, the pressing block including an output part, wherein an opening of the U-shape portion faces to the output part of the pressing block such that the elastic portion extends toward the output part of the pressing block along the plugging direction of the elastic clip.

15. The lighting apparatus of claim 13, wherein the elastic portion extends aslant, relative to the plane of the conductive portion, from the transition portion to an outer surface of the pressing block such that the elastic portion engages with the conductive portion.

16. The lighting apparatus of claim 13, wherein the light source plate is uneven, the elastic portion pressing down on the light source plate.

17. The lighting apparatus of claim 13, wherein the plugging portion inserted in the elastic clip hole has an arc shape cross section.

* * * * *